US006483802B1

(12) United States Patent
Walker et al.

(10) Patent No.: US 6,483,802 B1
(45) Date of Patent: *Nov. 19, 2002

(54) COMMUNICATION SYSTEM FOR DRIVING PAIRS OF TWISTED PAIR LINKS

(75) Inventors: Christopher Paul Hulme Walker, Milton Keynes; Barry Michael Cook, Market Drayton, both of (GB)

(73) Assignee: 4Links Ltd., Milton Keynes (GB)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,498

(22) Filed: May 11, 2000

Related U.S. Application Data

(63) Continuation of application No. 08/893,860, filed on Jul. 11, 1997, now Pat. No. 6,147,963.

(30) Foreign Application Priority Data

Jul. 11, 1996 (GB) ............................................. 9614561

(51) Int. Cl.[7] .............................. H04J 15/00; H04L 5/20
(52) U.S. Cl. ........................................ 370/200; 375/258
(58) Field of Search ................................. 370/200, 419, 370/439, 357, 366, 367, 368, 513, 514; 375/293, 257, 258

(56) References Cited

U.S. PATENT DOCUMENTS

| | | | | |
|---|---|---|---|---|
| 3,689,699 A | * | 9/1972 | Brenig et al. ............... 370/507 |
| 4,003,041 A | * | 1/1977 | Van Duuren et al. ......... 341/57 |
| 4,173,714 A | | 11/1979 | Bloch et al. .................. 179/99 |
| 4,583,214 A | | 4/1986 | Miyashita et al. ............. 370/5 |
| 4,910,750 A | * | 3/1990 | Fisher ......................... 375/292 |
| 4,953,055 A | * | 8/1990 | Douhet et al. ................ 361/62 |
| 5,341,371 A | * | 8/1994 | Simpson ..................... 370/438 |
| 5,488,627 A | * | 1/1996 | Hardin et al. ............... 375/139 |
| 5,550,864 A | * | 8/1996 | Toy et al. .................... 375/293 |
| 5,633,631 A | * | 5/1997 | Teckman ..................... 341/58 |
| 5,818,362 A | * | 10/1998 | Walker ........................ 341/57 |
| 5,956,624 A | * | 9/1999 | Hunsinger et al. ............ 455/65 |
| 6,147,963 A | * | 11/2000 | Walker et al. .............. 370/200 |

FOREIGN PATENT DOCUMENTS

| | | |
|---|---|---|
| EP | 0112716 | 7/1984 |
| EP | 0404994 | 1/1991 |
| EP | 0458648 | 11/1991 |
| GB | 1516751 | 7/1978 |
| GB | 1540414 | 2/1979 |
| GB | 2280826 | 2/1995 |

\* cited by examiner

Primary Examiner—Dang Ton
Assistant Examiner—Brian Nguyen
(74) Attorney, Agent, or Firm—Darby & Darby

(57) ABSTRACT

A communication. system includes two high speed communication links formed by pairs of transformers at either end thereof. A phantom circuit formed by the pairs of transformers is used to distribute power to devices connected to the high speed links. In transmission part of a communications system, data is transmitted under the control of a continuously variable frequency clock. Transmission is on parallel data-strobe links, and the receive includes circuitry to identify on which parallel the data signal is preset. A method and circuitry is provided for transmitting and receiving dc balanced data strobe signals.

23 Claims, 18 Drawing Sheets

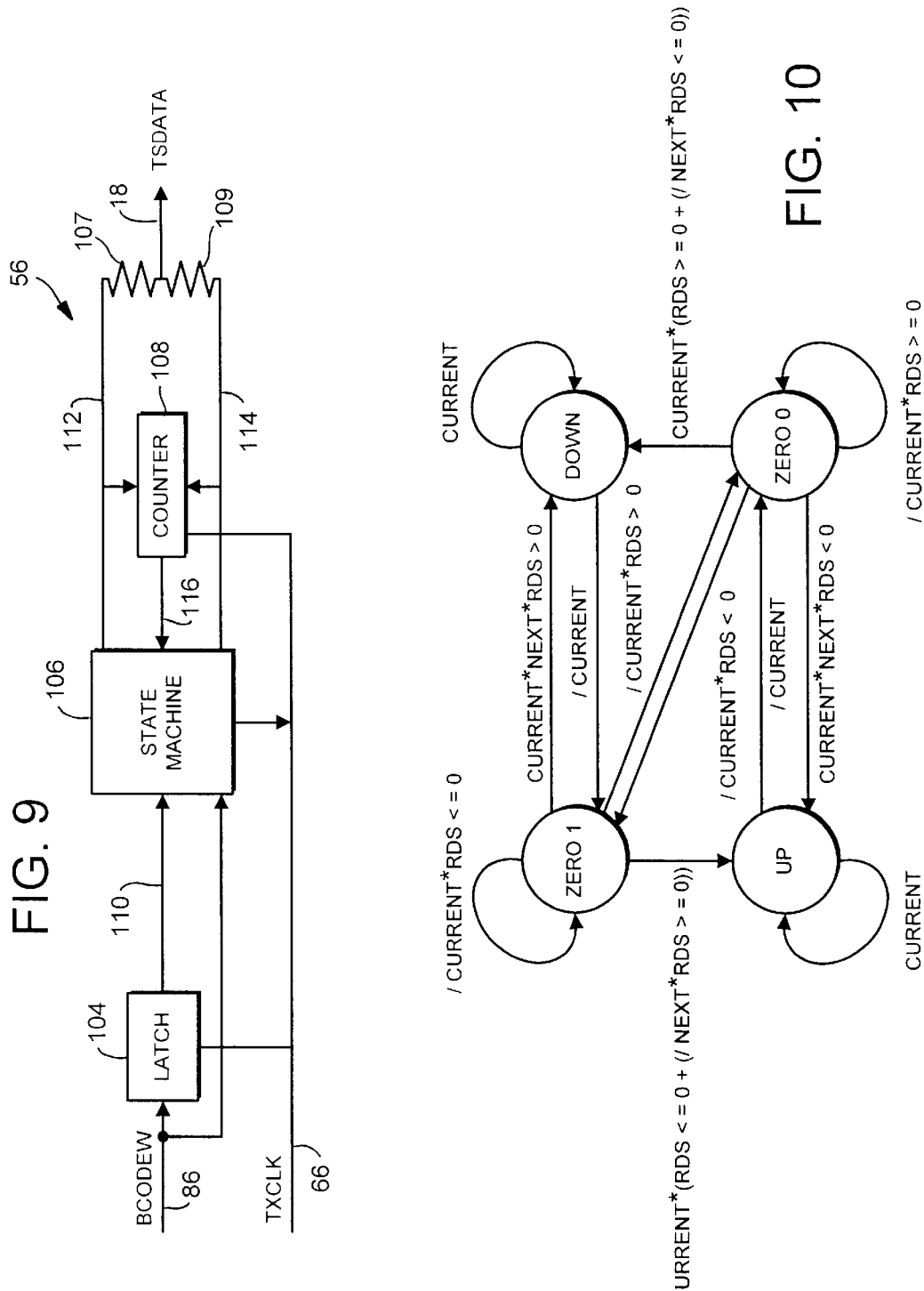

COMMUNICATION SYSTEM FOR DRIVING PAIRS OF TWISTED PAIR LINKS

This is a continuation, of application Ser. No. 08/893,860, filed Jul. 11, 1997 now U.S. Pat. No. 6,147,963. Each of these prior applications is hereby incorporated herein by reference, in its entirety.

FIELD OF THE INVENTION

The present invention relates to the use of twisted pair connections as communication links driven by transformer couplings, and particularly to the use of phantom circuits formed by pairs of transformers driving pairs of twisted pairs.

BACKGROUND TO THE INVENTION

A phantom circuit is formed by connections to the centre taps of a pair of transformers at a transmit end, which pair of transformers are linked by respective communication links to a pair of transformers at a receive end, connections to the centre taps of the transformers at the receive end forming the other end of the phantom circuit. The communication links between the two transformers of the transmit end and the two transformers of the receive end form two high speed communication links and the phantom circuit provides a further low speed communication link. Thus advantageously phantom circuits provide an additional communications link without the provision of additional communications link circuitry.

Typically the communication links formed by the respective pairs of transformers will transmit high speed data, typically between computers. The phantom circuit cannot support high speed communication such as that between computers, but can advantageously be used in accordance with the present invention to distribute power from a transmit end to a receive end; the phantom circuit being used to supply power to devices to which the high speed communication links are connected.

Thus according to the present invention there is provided a communication system comprising:
- a first high speed link having a first transformer interface at a transmit end and a second transformer interface at a receive end;
- a second high speed link having a third transformer interface at a transmit end and a fourth transformer interface at a receive end;
- a low speed link comprising a phantom circuit formed by the first to fourth transformers, the transmit end of the low speed link being formed by connections to the centre taps of the first and third transformers and the receive end of the low speed link being formed by connections to the centre taps of the second and fourth transformers;
- wherein the transmit end of the low speed link is connected to a power supply and at least one of the high speed links is connected to a device at the receive end for receiving signals from the respective high speed link, the receive end of the low speed link providing power to the device from the power supply.

Preferably one of the high speed links transmits a serial data signal, and the other high speed link transmits a strobe signal having transitions only at bit boundaries of the data signal where there are no transitions, thus forming a data-strobe communication link as disclosed in earlier European Patent Application Publication No. 0458648.

In addition to the distribution of power, the phantom circuit may be used to transmit low speed signals. The phantom circuit may also be used to distribute a global signalling clock. The global signalling clock may be implemented by providing a switch on the transmit side of the phantom circuit which switches the power supply for transmission in and out of the phantom circuit.

The phantom circuits may also be used to distribute power to remote destinations where there are no devices for receiving high speed communication signals.

The present invention also relates to a communication system in which a variable frequency clock is used in the transmission circuit. The invention is particularly, but not exclusively, concerned with the use of spread spectrum clocks in the transmission circuits of communications systems.

For communication networks, particularly those implemented in the home, there is a need to minimise electromagnetic radiation. The use of spread spectrum clocks reduces the peaks of electromagnetic radiation at harmonics of the clock frequency, and thus it would be advantageous to employ a variable frequency clock such as a spread spectrum clock in any communication system utilising a high speed network, particularly in the home.

SUMMARY OF THE INVENTION

Thus according to the present invention there is provided a communications interface comprising output circuitry for providing a data signal to be transmitted under the control of a transmit clock signal, the frequency of the transmit clock signal being continuously variable.

The data-strobe link can cope very well with changing clock frequency, whereas typical PLL clock recovery circuits may have more difficulty in tracking the viable frequency clock.

When using a variable frequency clock in a transmission circuit, further problems arise in attempting to recover the clock at the receive end. European Patent Application Publication No. 0458648 describes an encoding scheme where data is transmitted on one serial link, and on a parallel serial link a strobe signal is transmitted which has transitions only at bit boundaries of the data signal where there is no transition. Such an encoding scheme advantageously allows the transmit clock to be simply recovered at the receive end, and therefore such a communication system can be advantageously used with the variable clock.

Thus according to the present invention there is additionally provided a communications interface comprising:
- output circuitry for providing two parallel outputs, one in the form of a data signal and one in the form of a strobe signal and including strobe generation circuitry, wherein the data signal comprises a serial bit pattern and the strobe generation circuitry generates the strobe signal such that the strobe signal has signal transitions only at bit boundaries where there is no transition on the data signal, the strobe generation circuitry being controlled by a clock signal such that for each clock pulse where there is no signal transition in the data signal a signal transition is generated in the strobe signal, the frequency of the clock signal being continuously variable; and
- input circuitry having two inputs for receiving data and strobe signals, and including an exclusive-or circuit for receiving the data and strobe signals and generating a receive clock on the output thereof, the receive clock being generated with clock signal transitions having a timing matching that at which the strobe and data signals were transmitted.

The present invention also relates to receive circuitry for use in a communications system utilising data-strobe encoding in which the receiver is insensitive to which of the parallel signal lines the data signal is on. Data strobe encoding is described in earlier European Patent Application Publication No. 0458648.

In the data strobe encoding scheme, a data signal is transmitted on a serial data line, and a strobe signal transmitted on a serial strobe line parallel to the data line, the strobe signal having transitions only at bit boundaries of the data signal where there are no transitions. On the receive side, the transmit clock can be readily recovered by exclusive-ORing both the data and strobe signals.

According to the present invention there is provided data receiving circuitry comprising:

input circuitry having two inputs, one input for receiving a data signal and the other input for receiving a strobe signal, the strobe signal being parallel to the data signal and having signal transitions only at bit boundaries where there is no transition on the data signal;

an exclusive-or gate, having inputs connected to the two inputs, and generating a receive clock on the output thereof;

detection circuitry having two inputs coupled to the respective two inputs of the input circuitry and for detecting an expected bit sequence associated with the data signal on one of said two inputs;

output circuitry for outputting the data signal under the control of the receive clock; and selection circuitry for connecting the one of said inputs on which said sequence is detected to the output circuit.

The present invention further relates to a communications system code which utilises transformer couplings to communication links, and particularly to such a code employing a data strobe encoding scheme.

The data strobe encoding scheme is described in European Patent Application Publication No. 0458648. A serial data signal is transmitted on one line, and a serial strobe link signal transmitted parallel on a second line. The strobe signal has transmissions only at bit boundaries of the data signal at which there are no transitions on the data signal.

For certain applications, and particularly for high speed networks in the home, it is desirable to employ a communications system in which devices are transformer coupled to allow isolation. If transformer coupling is being used to interface to communication links, then the signals being transmitted must be dc balanced. However the data strobe communication code described in European Patent Application Publication No. 0458648 is not a dc balanced code.

Furthermore, for high speed networks and also particularly for applications of high speed networks in the home, it is desirable to use a simple encoding and decoding technique to minimise cost.

It is also desirable, particularly for applications of communication systems in the home, to minimise any electromagnetic radiation associated with the coding scheme.

A number of codes are in existence which have some of the desirable properties required for a high speed network in the home. The DS link code, mentioned hereinabove, is exceptionally simple to encode and decode, it uses two signal wires such that data is transmitted without further encoding on the data signal wire, and the strobe signal wire changes its state whenever the data signal wire does not change at bit boundaries. This also has the advantage that clock recovery is a simple exclusive ORing of the data and strobe signals at the receive end, so there is no need for a PLL or a DLL to recover the received clock. However there is nothing inherent in the DS link code which minimises electromagnetic radiation. A further major disadvantage of the DS link code is that it is not dc balanced and is therefore not suitable for transformer coupling.

There are many dc balanced codes and particularly pseudo-ternary codes which have the advantage that, in the quiescent state, there is no current flow in the coupling transformer. Regulated mark inversion, described in Electronic Letters, Nov. 9th 1995, pp. 1996–1997, is a simple pseudo-ternary code in which a 1 is always represented as a −1 or +1, and a 0 is always represented as 0. Thus the decoded data is always a simple rectification of the received signal. The regulated mark inversion code has an improved emission spectrum over many other codes, with reduced components at both high frequencies and low frequencies, and only increased components between one tenth and one hundredth of the bit rate. The regulated mark inversion code can be controlled to limit the run length of consecutive 1's, such that there are never more consecutive 1's than the maximum disparity permitted by the particular implementation of the regulated mark inversion code. By ensuring that transitions in the regulated mark inversion code are always between −1 and 0, 0 and −1, +1 and 0, or 0 and +1, and never between −1 and +1 or +1 and −1, then the frequency of the electromagnetic radiation can be further reduced. This also further simplifies the receiver, because it only has to see a transition, rather than discriminate between two different size of transitions of a ternary code. However, the regulated mark inversion code does not allow for simplified clock recovery at the receive end.

Neither the data strobe link code itself, nor the regulated mark inversion code, is particularly suitable for optical fibre implementation. Codes that are much more suitable include the serial HIPPI code and the HS-LINK code of IEEE 1355. These are binary codes which maintain dc balance by inverting the data if necessary to reduce the running digital sum of the code. Each code word includes an inversion flag to indicate inversion, and because the inversion has particular significance, it is normally accompanied by a parity bit which covers parity of both the data and the flag.

Thus it is an object of the present invention to provide a communication code which enables simple clock recovery at the receive end, is dc balanced, minimises electromagnetic radiation, and is suitable for transformer coupling.

Thus according to the present invention there is provided a method of establishing parallel data and strobe signal communication paths having dc balanced data and strobe signals on each path, comprising:

outputting a binary data signal;

generating and outputting a binary strobe signal, parallel to the binary data signal, having signal transitions only at bit boundaries where there is no transition on the parallel binary data signal; and encoding the binary data signal and the binary strobe signal into respective ternary dc balanced signals for transmission.

Preferably the step of encoding the binary data signal and the binary strobe signal into respective ternary dc balanced signals encodes such signals such that only single level logic transitions are permitted between successive trits of the ternary signals.

Preferably the encoding step comprises the steps of, for each of the data and strobe signal:

calculating the running digital sum of the ternary signal;

transmitting next binary 1 as ternary −1 if the running digital sum is positive and at least two 0's have been transmitted since the last ternary +1;

transmitting the next binary 1 as ternary +1 if the running digital sum is negative and at least two 0's have been transmitted since the last ternary −1;

transmitting at least two successive binary 1's as ternary −1's if the running digital sum is positive and the at least two binary 1's follow any number of 0's;

transmitting at least two successive binary 1's as ternary +1's if the running digital sum is negative and the at least two binary 1's follow any number of 0's; and otherwise reversing the polarity of each ternary 1 each time a run of at least one 0 occurs.

The present invention also provides data transmission circuitry comprising:

input circuitry for receiving a binary data signal;

strobe generation circuitry for generating a binary strobe signal, parallel to the binary data signal, and having signal transitions only at bit boundaries where there is no transition on the parallel binary data signal;

encoding circuitry for encoding the binary data and strobe signals into respective ternary dc balanced signals; and output circuitry for transmitting the ternary encoded data and strobe signals.

According to another aspect of the invention there is provided a method of decoding a ternary data signal and a ternary strobe signal, the strobe signal being parallel to the data signal and having signal transitions only at trit boundaries of the data signal where there is no transition, the method comprising:

rectifying the ternary data and strobe signals to generate binary data and strobe signals;

exclusive-ORing the data and strobe signals to generate a receive clock; and outputting the rectified data signals under the control of the receive clock.

This aspect of the invention also provides data receiving circuitry comprising:

input circuitry for receiving a ternary data signal and a ternary strobe signal, the strobe signal being parallel to the data signal and having signal transitions only at bit boundaries where there is no transition on the data signal;

rectification circuitry for rectifying the ternary data and strobe signals and generating binary data and strobe signals;

an exclusive-OR gate for receiving the data and strobe signals and generating the receive clock at its output; and output circuitry for outputting the binary data signal under the control of the receive clock.

For a better understanding of the present invention and to show how the same may be carried into effect, reference will now be made by way of example to the accompanying drawings.

BRIEF DESCRIPTION OF THE DRAWINGS

FIG. 9 is a block diagram of a ternary encoder;

FIG. 10 is a state diagram of the ternary encoder of FIG. 9;

DESCRIPTION OF THE PREFERRED EMBODIMENT

Figure 1:
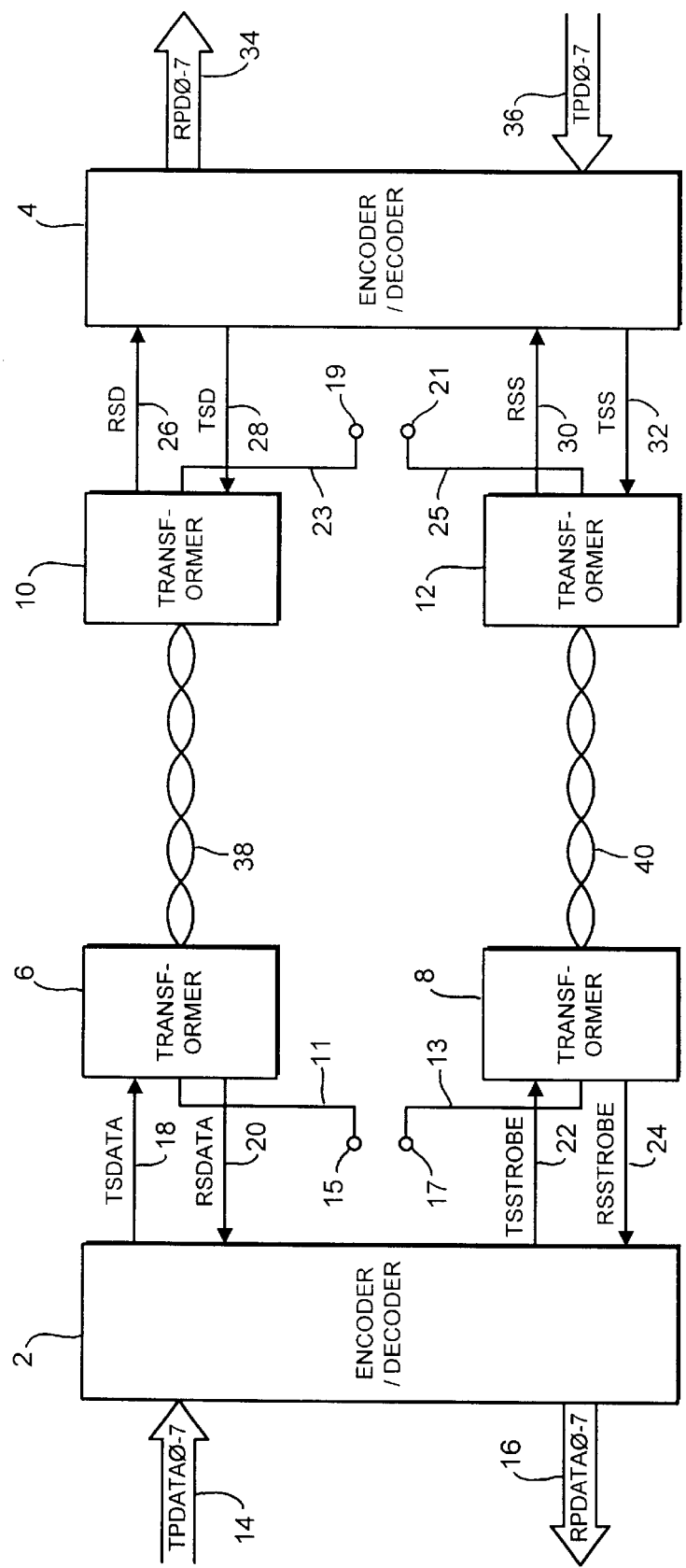
FIG. 1 is a block diagram of transmitting and receiving circuits for implementing the present invention.

FIG. 1 shows an exemplary embodiment of a communication interface according to the present invention.

A high speed twisted pair serial link 38 communicates serial data signals bidirectionally between transformers 6 and 10 which provide a communications interface for data signals to the respective encoders/decoders 2 and 4. Similarly, a high speed serial twisted pair link 40 communicates serial strobe signals between the pair of transformers 8 and 12 which provide a communications interface for strobe signals to the respective encoders/decoders 2 and 4. The encoder/decoder 2 receive bytes of parallel data TPDATA0–7 on bus 14, encodes it in accordance with the present invention as discussed in detail hereinafter, and outputs a serial ternary data signal TSDATA on line 18 and a serial ternary strobe signal TSSTROBE on line 22 to the respective transformers 6 and 8 for transmission on the respective twisted pair signal lines 38 and 40. The respective transformers 10 and 12 receive the encoded data and strobe ternary signals on twisted pairs 38 and 40. The transformer 10 communicates the ternary data signal received RSD from twisted pair 38 to the encoder/decoder 4 on line 26. The transformer 12 communicates the ternary strobe signal RSS received from twisted pair 40 on line 30 to encoder/decoder 4. The encoder/decoder 4 decodes the received ternary data signal RSD and the received ternary strobe signal RSS into parallel bytes of binary data RPD0–7 which it outputs on bus 34.

The bytes of parallel data TPDATA0–7 on bus 14 may additionally have a control bit associated therewith. Such control bit may indicate, when set, that the byte TPDATA0–7 contains control information for use by the encoder/decoder 2. The control information may be for flow control purposes between the source of the parallel data TPDATA0–7 and the encoder/decoder 2. Similarly the encoder/decoder 2 may generate a control bit associated with the parallel data byte RPDATA0–7 for transmission therewith as a 9 bit bus.

The encoder/decoder 4 receives on bus 36 parallel bytes of data to be transmitted TPD0–7, and encodes it into a ternary serial data signal to be transmitted TSD, on line 28 and a ternary serial strobe signal to be transmitted TSS on line 32. The transformer 10 communicates the signal TSD via twisted pair 38 to the transformer 6, and the transformer 12 communicates the ternary signal TSS via twisted pair 40 to the transformer 8. The transformer 6 outputs the received ternary data from twisted pair 38 as signal RSDATA on line 20, and the transformer 8 outputs the received ternary strobe signal from twisted pair line 40 as the signal RSSTROBE on line 24. The encoder/decoder 2 receives the ternary. signals RSDATA and RSSTROBE and decodes them into parallel bytes RPDATA0–7 and outputs them on bus 16.

In addition to providing the bidirectional communication of signals down the high speed twisted pair links 38 and 40, the four transformers 6, 8, 10 and 12 in addition form a "phantom circuit". As will be described in greater detail hereinafter, this phantom circuit is formed by providing a connection line 11 to the centre tap of the primary winding of the transformer 6, and a connection line 13 to the centre tap of the primary winding of the transformer 8. Connections 11 and 13 have respective terminals 15 and 17 for inputting signals between the centre taps of the primary windings of transformers 6 and 8. Similarly, a connection line 23 is provided from a terminal 19 to the centre tap of the secondary winding of the transformer 10 and a connection line 25 is provided from the terminal 21 to a centre tap of the secondary winding of the transformer 12. In this way, a signal applied to the terminals 15 and 17 is transmitted down the phantom circuit and received at the terminals 19 and 21. Bidirectional communication down the phantom circuit is possible, such that a signal applied to the terminals 19 and 21 is also received at the terminals 15 and 17. The advantageous utilisation of this phantom circuit in accordance with the present invention will be discussed in greater detail hereinafter.

Figure 2:
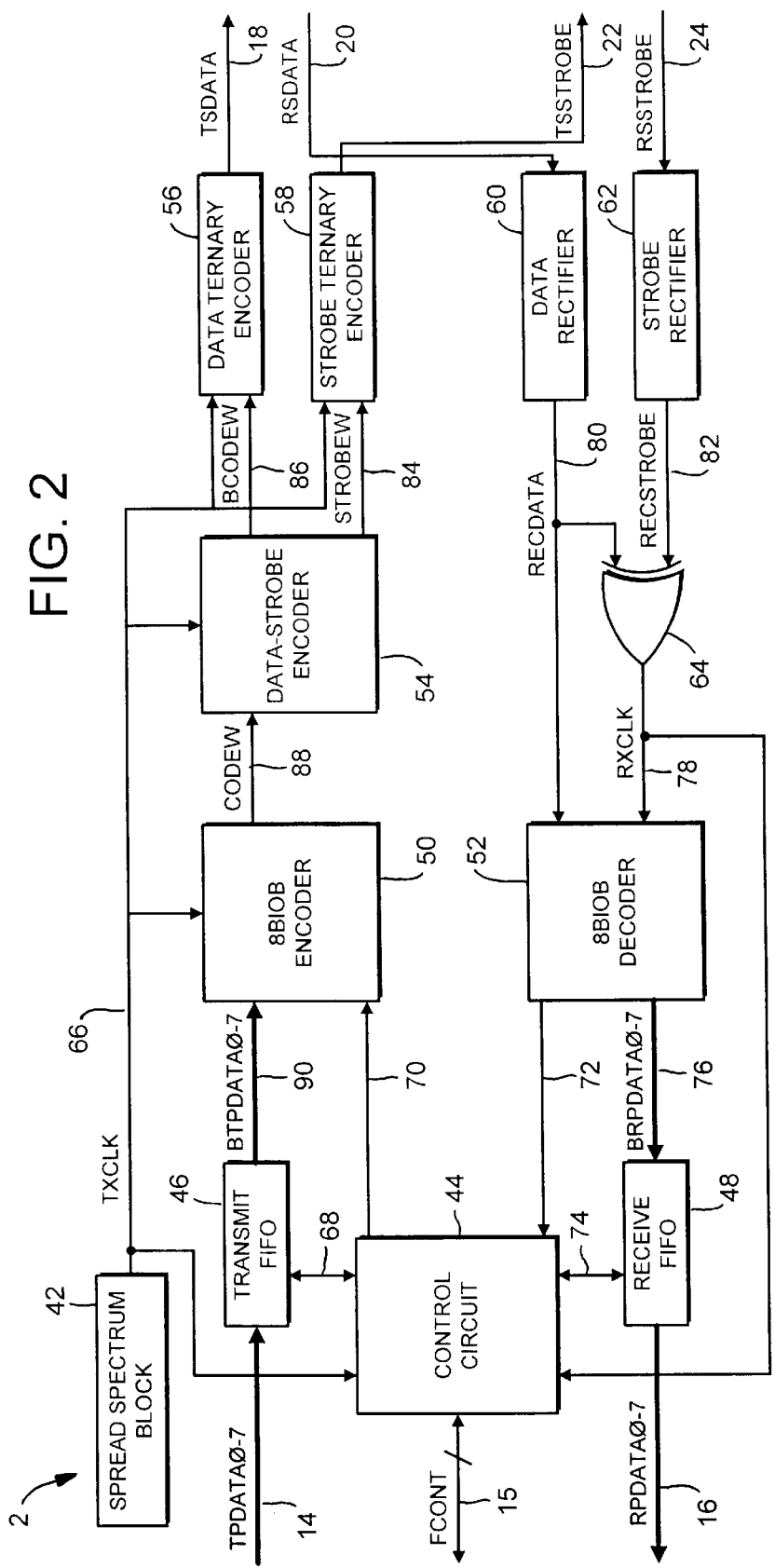
FIG. 2 is a block diagram of an encoder/decoder such as may be used in the transmitting and receiving circuits of FIG. 1.

Referring now to FIG. 2, there is shown a block diagram of the encoder/decoder 2 of FIG. 1 according to an exemplary embodiment of the present invention. The encoder/decoder 4 of FIG. 1 is constructed identically to the encoder/decoder 2.

The encoder/decoder 2 comprises a control circuit 44, a transmit FIFO 46, an 8B10B encoder 50, a data-strobe encoder 54, a data ternary encoder 56, strobe ternary encoder 58, a data rectifier 60, a strobe rectifier 62, an exclusive OR gate 64, an 8B10B decoder 52, a receive FIFO 48, and a spread spectrum clock 42.

The spread spectrum clock 42 provides a transmit clock signal TXCLK on line 66 to the control circuit 44, the 8B10B encoder 50, the data-strobe encoder 54, the data ternary encoder 56 and the strobe ternary encoder 58. The parallel data bytes to be encoded TPDATA0–7 on bus 14 are input successively to the transmit FIFO 46 under the control of control signals on line 68 from the control circuit 44. The buffered data bytes BTPDATA0–7 from the transmit FIFO 46 are output on bus 90 to the 8B10B encoder 50. The transfer of the data bytes to be transmitted to the 8B10B encoder 50 from the transmit FIFO 46 is also controlled by control signals on line 68 from the control circuit 44, which not only communicates control signals to the transmit FIFO 46 on line 68 but also to the 8B10B encoder 50 on line 70. In addition, the control circuit may provide for flow control mechanisms with the device sending the data bytes to be transmitted, and in such event the transmit FIFO 46 may return control signals to the control circuit 44 on line 68 such as flags indicating the fullness of the FIFO and whether there is enough space in the transmit FIFO 46 to receive additional bytes of data. Although the signals for the flow control between the encoder/decoder 2 of FIG. 2 and the device sending the data to be transmitted TPDATA0–7 on bus 14 is not shown in FIG. 2, the implementation of such will be well understood by one skilled in the art.

The 8B10B encoder 50 encodes the buffered data bytes BTPDATA0–7 in accordance with the present invention as discussed in detail hereinafter, and outputs serial code-words CODEW on line 88 to the data-strobe encoder 54. As will be discussed further in detail hereinbelow, the data-strobe encoder 54 buffers the serial data code-word CODEW on line 88 and transfers to its output on line 86 the buffered serial data code-word BCODEW. In addition, the data-strobe encoder 54 generates a serial strobe signal STROBEW on line 84 parallel to the buffered serial data code-word BCODEW. The buffered serial data code-words BCODEW on line 86 are input to the data ternary encoder 56, which in accordance with the present invention converts the binary serial data to be transmitted into ternary serial data as signals TSDATA on line 18. Similarly the strobe ternary encoder 58 receives the signal STROBEW on line 84 and converts such into a ternary strobe signal TSSTROBE for transmission on line 22.

On the receive side, the data rectifier 60 receives the ternary encoded serial data RSDATA on line 20 and the strobe rectifier 62 receives the ternary encoded strobe signal RSSTROBE on line 24. Each of the data rectifier 60 and strobe rectifier 62 rectifies the ternary signal input thereto to produce a respective binary serial signal on the respective ones of the outputs on lines 80 and 82. The rectified data serial signal RECDATA on line 80 is input to the 8B10B decoder 52. The rectified strobe serial signal RECSTROBE on line 82 forms an input, together with the rectified serial data signal RECDATA on line 80 to the exclusive OR gate 64. As will be understood from the description of the data-strobe encoder 54 given hereinafter, the output of the exclusive OR gate 64 reconstructs the transmit clock as the receive clock RXCLK on line 78, and the receive clock RXCLK is used to clock the 8B10B decoder 52 and the control circuit 44. The 8B10B decoder 52 receives the received code-word data RECDATA on line 80, and decodes it in accordance with the present invention as discussed in detail hereinafter to output decoded bytes of data BRP-DATA0–7 on bus 76. The 8B10B decoder 52 transmits control signals on line 72 to the control circuit 44. The decoded data bytes BRPDATA0–7 on bus 76 are input to a receive FIFO 48 under control of the control signals 74 from the control circuit 44, and output from the receive FIFO 48 onto the data bus 16 as signals RPDATA 0–7. The signals 74 linking the control circuit 44 to the receive FIFO 48 will preferably be bidirectional to allow the control circuit to control the flow of data to and from the receive FIFO 48 in accordance with the relative fullness of the FIFO.

The control circuit 44 receives and transmits control signals FCONT on lines 15. The control circuit 44 may receive a write signal associated with the parallel data byte TPDATA0–7 for controlling the writing of the data into the transmit FIFO 46, and may transmit a flag status signal of the transmit FIFO 46 to the source of the parallel byte of data TPDATA0–7 indicating that there is space in the transmit FIFO 46. The control circuit 44 may also receive a read signal from the destination circuit to which the parallel data byte RPDATA0–7 is to be read, the read signal for controlling the reading of data from the receive FIFO 48. The control circuit 44 may generate a signal on the signals FCONT indicating that the receive FIFO 48 is not empty and contains data bytes to be read.

In the embodiment in which the data bytes TPDATA0–7 and RPDATA0–7 have control bits associated therewith the transmit FIFO 46 and the receive FIFO 48 will each be 9 bits wide, the ninth control bit being used by the control circuit 44 to determine whether the data byte TPDATA0–7 is for control purposes or transmission on the twisted pair 38. Alternatively if the control circuit 44 is generating a control byte it will set the control bit in the FIFO 48.

In accordance with well known techniques, the control circuit 44 may encode an interface flow control mechanism into the data transmitted between the interfaces at either end of the high speed twisted pair communication links. Thus the control circuit 44 may control the 8B10B encoder via line 70 to add flow control information to the encoded data. This flow control information is then decoded by the 8B10B decoder 52 at the receive end, and the flow control information passed via line 72 to the control circuit 44. Such techniques of flow control are well known in the art, and are not discussed in detail herein since they are not specific to the inventive code.

Figure 3:
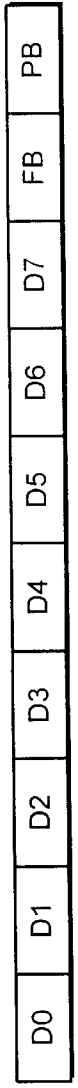
FIG. 3 is an example of a code-word encoded in accordance with the present invention.

The 8B10B encoder 50 of the decoder/encoder 2 encodes the parallel byte of data BTPDATA0–7 on bus 90 into a serial signal CODEW on line 88 comprising 10 bit code-words. The 8B10B encoder 50 preferably adds a flag bit and a parity bit to the byte of data to form a code-word, and then converts the 10 bit code-word from parallel format into serial format as will be described in detail hereinafter with reference to FIG. 4. The structure of the serial code-words CODEW output by the 8B10B encoder on line 88 is shown in FIG. 3. The code-word CODEW comprises eight data bits D0–D7, a flag bit FB and a parity bit PB. Preferably the flag bit FB and the parity bit PB are added to the end of the serial code-word. Thus in FIG. 3 the data bit D0 is the least significant bit and the parity bit PB is the most significant bit. By adding the flag and parity bits to the end of the serial code-word the time for any logic operations on the data byte of the serial code-word is maximised. The parity bit PB is preferably chosen to ensure that there is an odd number of 1's in the ten bit code-word. As will be described in further detail hereafter, the flag bit FB indicates whether the data bits D0–D7 in the code-word are the true data bits or the inverted data bits. The flag bit FB is set when the data byte in the serial code-word is inverted. Referring to Table I below there is shown, for all ten bit code-words having an odd number of ones, a breakdown of the code-words with 1, 3, 5, 7, 9 ones therein, showing the corresponding number of zeros in the code-word, the disparity of the code-word, and the number of possible code-words having that number of ones that number of zeros and that particular disparity.

TABLE I

| Number of ones in code-word | Number of zeros in code-word | Disparity of the code-word | Number of code-words with this disparity |
|---|---|---|---|
| 1 | 9 | −8 | 10 |
| 3 | 7 | −4 | 120 |
| 5 | 5 | 0 | 252 |
| 7 | 3 | 4 | 120 |
| 9 | 1 | 8 | 10 |

It is desirable to ensure that the magnitude of the running digital sum at code-word boundaries is minimited, and preferably maintained at zero to ensure dc balance of the code. As can be seen from Table I, code-words will have a disparity of either 0, ±4, or ±8. Thus, as will be described further hereafter, the magnitude of the running digital sum can be minimised by inverting the data byte in certain code-words so as to select a code-word having a positive or negative disparity rather than a negative or positive disparity respectively.

Thus, according to the preferable encoding scheme, if the code-word after having a parity bit added to it and a flag bit set at zero included therein has a disparity, of zero, i.e. an equal number of ones and zeros then the code-word is transmitted true, since the disparity of zero will not affect the running digital sum at code-word boundaries.

However, if the code-word after having the parity bit added thereto and the flag bit set at zero has an unequal number of ones and zeros, then it will either be transmitted true, or else inverted with the flag bit set to one, in order to reduce or to change the sign of the running digital sum at code-word boundaries. For example, the data byte 00000111 (with the least significant bit at the left and most significant bit at the right) would be transmitted as the code-word 0000011100 if the running digital sum of the code, prior to the transmission of this code-word, was positive. Thus the data of the code-word would be transmitted true, the flag bit being set to zero, and the parity bit being set to zero to ensure an odd number of 1's in the code-word. This transmitted code-word has a negative disparity, which would either reduce the magnitude of the running digital sum or else make the running digital sum negative. However, in this example if the running digital sum was currently negative, then the data in the code-word would be inverted, the flag bit set at one to indicate inversion of the data, and the parity bit set to one to ensure an odd number of ones, such that the code-word transmitted would be 1111100011. Thus this would reduce the magnitude of the running digital sum or else make the running digital sum positive.

As is clear from Table I, the disparity of the non-zero disparity code-words is either ±4 or ±8. Thus in this exemplary embodiment of the invention a limit of ±8 is placed on the running digital sum at code-word boundaries. Thus a rule for inversion of data in the code-word is set such that the data in the code-word is either inverted or not inverted to ensure that the running digital sum at code-word boundaries is maintained within the ±8 limit.

If the code-word to be transmitted has an equal number of ones and zeros, then it is always transmitted with the data true. For example, the data byte 0011 0011 will be transmitted as the code-word 0011 0011 01, the flag bit being set at 0 due to indicate non-inversion, and the parity bit being set at 1 to provide an odd number of 1's, the resulting disparity of the code-word being zero. The data byte 0011 0011 having five ones would, when encoded as a code-word without inversion, result in the code-word 0011 0111 00 having zero disparity, the flag bit being set at zero to indicate non-inversion and the parity bit being set at zero to ensure an odd number of ones.

The fact that zero disparity code-words are always transmitted true, leaves a large number of code-words unused. That is, those code-words which are the inverse of zero disparity code-words. For example, the two code-words described in the preceding paragraph having non-inverted data provide two unused code-words in which the flag bit is set to one and the code-words still have zero disparity, namely 1100 1100 10 and 1100 1000 11. These unused code-words can advantageously be used for control codes. In particular they may be used for implementing a flow control mechanism, for indicating end of messages, for indicating end of packets, for transmitting idle signals etc. Advantageously they may be used to implement the inventive "Go To Standby" control protocol as described herein later. The control codes may also be used to distribute a synchronous clock, or as part of a safety protocol for optical fibre. There may be eight or even more control codes using the unused codes.

From Table I hereinabove, it can be seen that there are 252 code-words having zero disparity, but from the above discussion it will be clear that only half of these code-words are needed to encode data. Thus there are 126 unused codes having zero disparity, and it will be clear that only a very small proportion of these unused codes need to be used for control purposes, and therefore a large number of zero disparity code-words unused are still available even after a small number have been allocated for control purposes.

By placing a constraint on the running digital sum between code-words of ±8 and selecting the inverted or non-inverted data in the code-words to ensure that the running digital sum is maintained within these limits as discussed hereinabove it is however, still possible for the instantaneous run length of the code other than at code-word boundaries to become much larger than ±8. For example, if prior to transmission of the next code-word the running digital sum at the code-word boundary is at −8, a code-word having a disparity of +4 is transmitted, and then a code-word having disparity of +8 is transmitted, then a possible bit sequence that could occur is 0111 1111 11 followed by 1111 1110 00 to give a run length of 16. Such a long run length is undesirable, and in a preferable embodiment of the code long run lengths such as this are eliminated, as described in detail hereinafter.

Furthermore, encoded data is desirably transmitted as a data-strobe signal in accordance with the encoding scheme described in earlier European Patent Application Publication No. 0458648. The data-strobe encoding scheme described therein transmits a data signal on a data line, and a parallel strobe signal on the strobe line. The nature of the generation of the strobe signal is such that for every bit boundary of the data signal for which there is no transition on the data signal there is a transition on the strobe signal, and for every bit boundary of the data signal for which there is a transition on the data signal there is no transition on the strobe signal. This code advantageously allows simple clock recovery at the receiver end. Thus, in seeking to eliminate excessive run lengths on the data line, it is also necessary to consider those data sequences on the data line which will cause excessive run lengths on the strobe line.

In order to achieve the desirable aim of reducing the maximum run length that can be produced by the code on either the data or the parallel strobe signal, the unused codes having zero disparity but having their data inverted and their flag bit set to 1 which are not used for control purposes can be used to substitute code-words which contribute to extreme run lengths, whether the code-word causes an extreme run length on the data signal or causes a consequential extreme run length on the parallel strobe signal.

The code-words on the data signal line that need elimination due to their effect on the run length of the code, and to be substituted by the unused control codes are:

a) code-words having disparity of ±8 (for example 1111 1111 10);

b) code-words having excessive leading run-length on the data signal, such as 1111 1110 00 (where the data byte is true) or 1111 1100 10 (where the data byte is inverted). These code-words are actually the worst-case run-lengths on the data signal from those codes with disparity ±4;

c) code-words having excessive trailing run-length on the data signal (which can occur only when the data byte is inverted and the flag bit consequently set at 1) such as 0001 1111 11. This code-word is the worst-case trailing run-length on the data signal from those codes with disparity ±4;

d) code-words on the data signal which cause an excessive leading run-length on the parallel strobe signal, such as 0101 0111 00 (where the data byte is true) or 0101 0100 10 (where the data byte is inverted) or 1010 1011 00 (where the resulting code-word is zero-disparity; and e) code-words on the data signal which cause an excessive trailing run-length on the parallel strobe signal, such as 1111 0101 01 (where the data byte is true) or 0000 1010 10 (where the data byte is inverted) or 1001 0101 01 (where the resulting code-word is zero disparity).

The number of violating codes obviously depends on the run-length limit selected. For example, with a total run-length limit of 10 selected, and with consequently permitted leading and trailing run-lengths being a maximum of 5, less than 30 code-words need substitution, which is easily managed with the 126 code-words available.

If the run-length limit is chosen as 6, with leading and trailing limits of 3, there are more codes needing substitution than there are available codes. Therefore in the described preferred embodiment the trailing run-length is relaxed to a limit of 4, with the leading run-length limit at 3, to give an overall run-length limit of 7. Although there are apparently, within these rules, more code-words needing substitution than there are code-words available, some of the violating code-words have zero-disparity, and it is possible in some of these cases to remove the violation without using one of the substitution codes.

For the run-length limit of 7, a violation is a leading run-length of 4 or more on either the data or strobe signal, or a trailing run-length of 5 or more on either the data or strobe signal. For violating code-words with non-zero disparity, then substitution by one of the unused code-words including inverted data is necessary. This is a simple matter of mapping violating code-words having non-zero disparity to unused zero disparity code-words. For violating code-words with zero disparity, the code-word is transmitted according to the following rules:

a) for zero disparity code-words with excessive leading run-length on the data signal, such as 1111 0000 01, use the inverse 0000 1111 10, which does not violate;

b) the only cases of excessive trailing run length on the data signal for zero-disparity code-words are the inverted codes with both flag-bit and parity bit set such as 1000 0011 11. It is not necessary to use these codes because the true 0111 1100 00 does not violate. For a run-length limit of seven, there is actually no code violating this criterion which does not also violate other criteria. The run-length limit of seven does include one zero-disparity code whose inverse violates the leading data signal run length, but whose true code does not violate;

c) for zero-disparity code-words on the data signal which cause excessive leading run-length on the strobe signal, such as 1010 1011 00, invert or not to make it the same as the parity bit (the last bit transmitted) of the previous code-word. For example, with the previous parity bit set to one, the example code-word would not be inverted: xxxx xxxx x1 1010 1011 00, but if the previous parity bit had been set to zero, the code-word would be inverted: xxxx xxxx x0;

d) for zero disparity code-words on the data signal excessive trailing run-length on the strobe signal, such as 1001 0101 01 when the parity bit of the code-word is set, force the flag bit to one which in turn forces the parity bit to zero 1001 0101 10 which removes the violation. The resulting code-words are actually codes that would otherwise be code-words used for substitution, but the logic may be simpler to follow this rule than to substitute in these cases;

e) as separate rules are described above for leading and trailing violations on both the data signal itself and transitions on the data signal which cause a violation on the strobe signal, then any zero disparity code-word which violates more than one of these conditions must be substituted, for example the code-word 1010 0101 01 on the data signal, which causes a leading run length violation on the strobe signal of three and a trailing run-length on the strobe signal of five, would violate both leading and trailing run-lengths for an overall run-length limit of seven described above.

An example set of code-words to meet a run-length constraint of seven on both the data and strobe signals is given in Appendix 1. This appendix includes at least one example of each of the rules listed as (a) to (d) above, with the code-words violating more than one of those rules substituted by an unused code-word. In addition, in the example coding scheme shown in Appendix 1 the violating code-words having a non-zero disparity are substituted with unused code-words. The example code-word given in Appendix 1 as decimal 50 is an example of rule (a) above, the example code-word given in Appendix 1 as decimal 240 is an example of rule (b) above, the example code-word given as decimal 213 in Appendix 1 is an example of rule (c) above, and the example code-word given as decimal 169 in Appendix 1 is an example of rule (d). In addition, decimal 165 given in the enclosed Appendix 1 is an example of a code-word which violates both leading and trailing edge constraints, and specifically substitution of the code-word 1010 0101 01 given as an example in rule (e) above.

Figure 4:
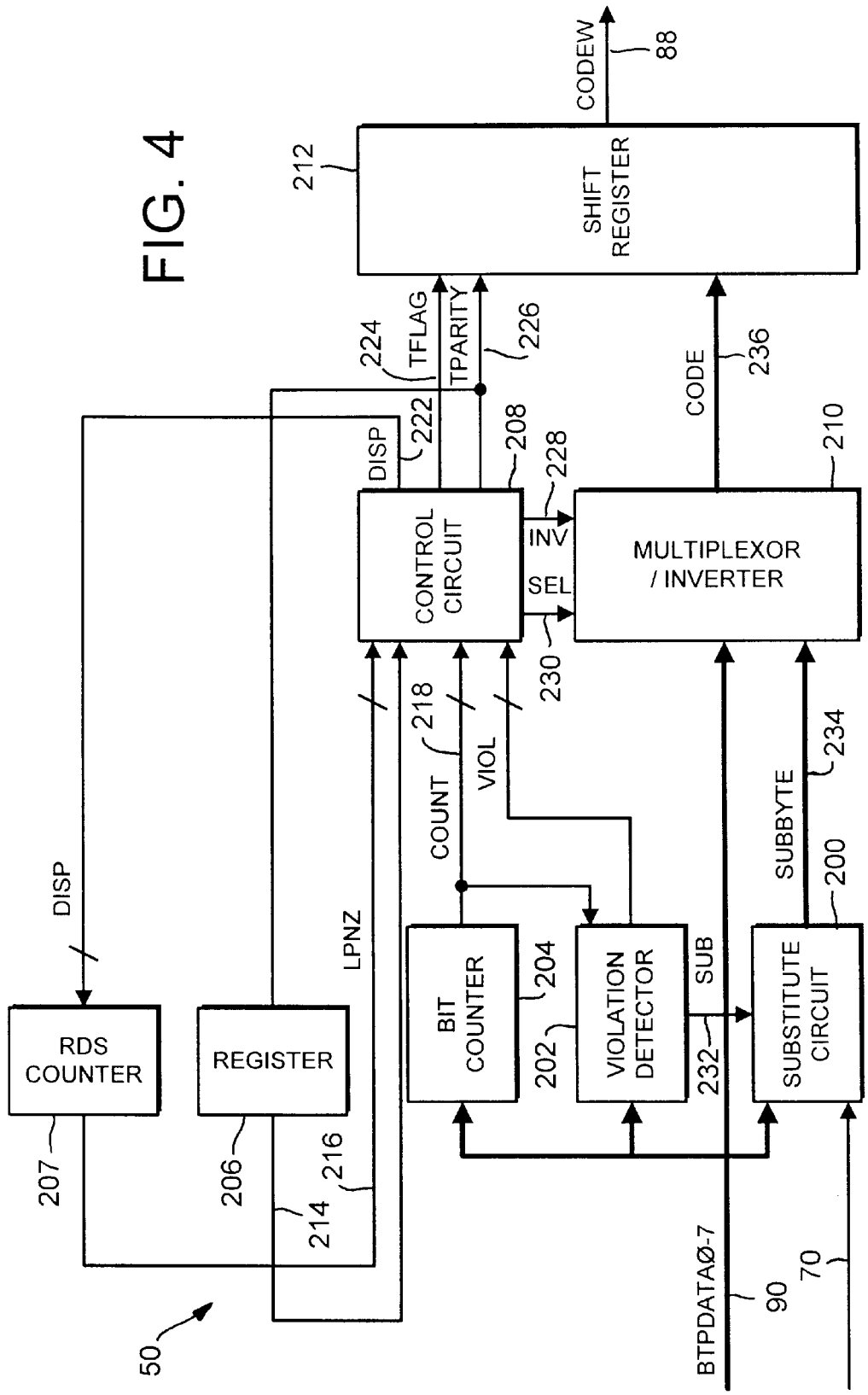
FIG. 4 is a block diagram of an implementation of an encoder according to the present invention.

Referring to FIG. 4 there is shown an example implementation of an 8B10B encoder 50 according to the present invention. The 8B10B encoder 50 includes a control circuit 208, a multiplexor/inverter 210, a substitute circuit 200, a violation detector 202, a bit counter 204, a register 206, a RDS counter 207 and a shift register 212. The parallel data bytes to be encoded BTPDATA0–7 on bus 90 form inputs to the multiplexor/invertor 210, the substitute circuit 200, the violation detector 202 and the bit counter 204. The substitute circuit 200 receives the control signal 70 from the control circuit 44. The substitute circuit 200 also outputs substitution bytes SUBBYTE on bus 234 to the multiplexor/invertor 210 as will be described further hereinafter. The violation detector 202 outputs a control signal SUB on line 232 to the substitute circuit 200, and a plurality of control signals VIOL on lines 220 to the control circuit 208. The bit counter 204 outputs a count signal COUNT on lines 218 to the control circuit 208 and the violation detector 202. The multiplexor/invertor 210 outputs the data byte of the code-word CODE on bus 236, and the control circuit 208 outputs the flag bit TFLAG of the code-word on line 224 and the parity bit TPARITY on line 226. The data bus CODE, flag bit TFLAG and the parity TPARITY form inputs to the shift register 212. In addition the control circuit 208 outputs the disparity DISP of the code-word on lines 222. The disparity DISP of the code-word on lines 222 forms an input to the RDS counter 207. The RDS counter 207 calculates the running digital sum of the code at code-word boundaries using the code-word disparity DISP presented at its inputs for successive code-words. The RDS counter 207 outputs a signal LPNZ on line 216, which is set if the last non-zero running digital sum was positive, and not set if the last non-zero running digital sum was negative.

The parity bit TPARITY on line 226 forms an input to the register 206. The register 206 outputs on line 214 the previous parity bit PTPARITY which is the parity bit TPARITY on line 226 buffered by one clock cycle. Although not shown in FIG. 4, each of the circuit elements shown therein receive the transmit clock TXCLK on line 66.

In operation, the violation detector 202 monitors incoming data bytes BTPDATA0–7 on bus 90 to see whether the violating conditions exist which require either the data byte in the code-word to be inverted to minimise the running digital sum at code-word boundaries, or substitution of the data byte by a substitute code-word so as to minimise the run length of the code. By looking at the data bytes BTBDATA0–7 and receiving the signal COUNT on lines 218 from the bit counter 204, which gives the number of 1's in the data byte, the violation detector itself can determine the disparity for the resulting code-word by itself calculating the parity bit, the flag bit obviously being considered as set to 0 in this calculation since the data is not yet inverted. If the violation detector 202 detects no violations, then the signals VIOL on line 220 and SUB on line 232 are not set. The bit counter 204 counts the bits in the data byte BTPDATA0–7 and provides a bit count as the signal COUNT on line 218 to the control circuit 208. When the violation detector 202 is not indicating a violation, the control circuit controls the multiplexor/inverter using the control signal SEL on line 230 to transfer the data bytes BTPDATA0–7 on bus 90 to the output thereof as the code byte CODE on bus 236. The control circuit 208 generates the parity bit TPARITY before the code-word in dependence on the signal COUNT to ensure an odd number of bits in the code-word. In addition if the signal LPNZ input to the control circuit on line 216, which effectively indicates whether the running digital sum prior to transmission of the current code-word was positive or negative if non-zero, dictates such, the control circuit 208 sets the signal INV on line 228 to invert the data at the output of the multiplexor/invertor 210. In such event the control circuit 208 also directly sets the flag signal TFLAG on line 224. The shift register 212 merely converts the parallel code-word formed by the bus 236 and the signals on lines 226 and 224 into a serial code-word for transmission CODEW on line 88.

When the violation detector 202 detects the violation in the incoming data byte BTPDATA0–7, which violations have been summarised in the above rules, the appropriate violation is identified to the control circuit as a signal VIOL on lines 220. In accordance with the type of violation identified by the violation detector, the control circuit 208 will use the various inputs presented thereto to determine substitution of the incoming data byte in accordance with the above rules. For instance, if the violation detected is one that requires the incoming data byte to be substituted for an unused code-word having 0 disparity, then in addition to setting the signals VIOL to the control circuit 208 the violation detector also sets the signal SUB on line 232 to select the appropriate substitution data byte from the substitute circuit 200, which is output on bus 234 as the signal SUBBYTE. The control circuit 208 will then set the select signal SEL on line 230 such that the byte SUBBYTE on bus 234 is transferred to the output as the byte CODE on bus 236. The control circuit 208 will then set the flag bit TFLAG and the parity bit TPARITY accordingly. When the control circuit 208 is substituting an incoming data byte for an unused code-word having 0 disparity, then the signal LPNZ indicating whether the last non-zero running digital sum was positive or negative does not affect whether the outputs of the multiplexor/invertor are inverted.

The control circuit 208 receives as one of its inputs the previous parity bit PTPARITY of the last code-word transmitted. Thus, when a violation such as illustrated in rule c) above occurs, the control circuit 208 can invert or not invert the signals on the output of the multiplexor/inverter 210 by setting the signal INV on line 228 appropriately in dependence on the previous parity bit PTPARITY of the last code-word transmitted.

In addition the substitute circuit 200 receives the control signal 70 from the control circuit 44. In this way the control circuit 44 can select. from the substitute circuit 200 those unused code-words having 0 disparity which have been reserved for control purposes.

Figure 5:
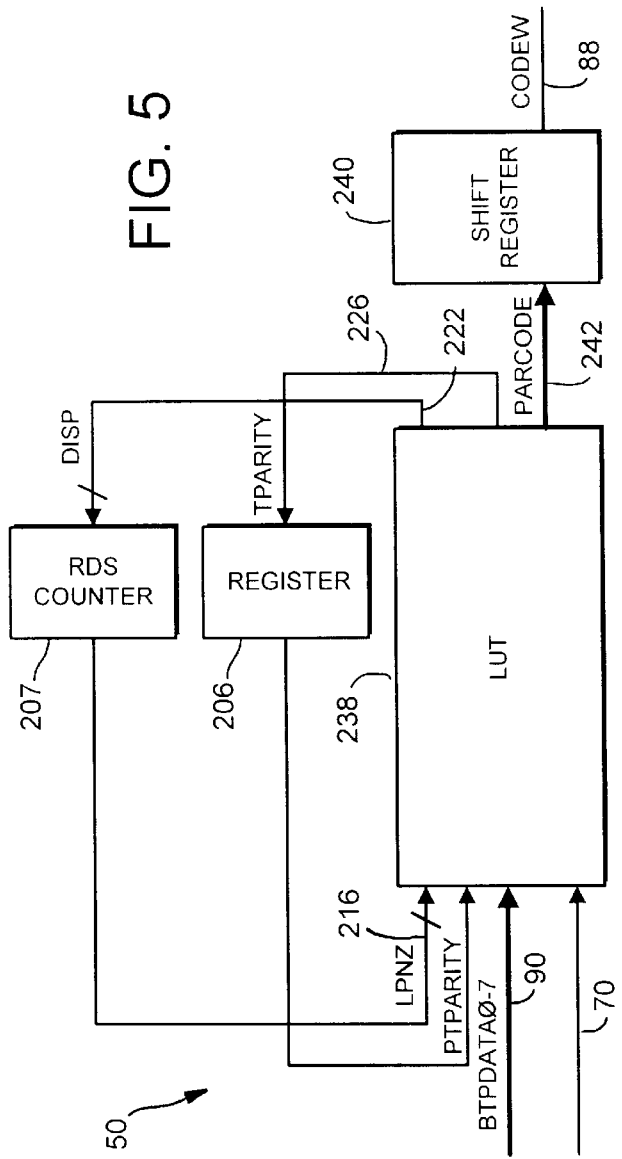
FIG. 5 is a block diagram of another implementation of an encoder according to the present invention.

Referring to FIG. 5 there is shown an alternative implementation of the 8B10B encoder So which employs a look-up table. In this embodiment, the 8B10B encoder 50 includes a look-up table 238, a shift register 240, the register 206 and RDS counter 207 employed in the embodiment of FIG. 4. Again the register 206 receives the parity bit TPARITY of the current code-word and the RDS counter 207 receives the disparity DISP of the current code-word, which signals in this embodiment are stored and output from, the look-up table 238. In addition the look-up table 238 outputs on a 10 bit bus 242 the code-word to be transmitted in parallel format PARCODE which forms an input to the shift register 240. It will be appreciated that the parity bit TPARITY output by the look-up table 238 on line 226 is actually one of the signals on the bus 242, but is shown separately in FIG. 5 for ease of explanation. As in FIG. 4, the register 206 records the parity bit PTPARITY of the previous code-word transmitted on line 214 and the signal LPNZ on line 216. In the embodiment of FIG. 5 the signal PTPARITY and the signals LPNZ form inputs to the look-up table 238. The look-up table 238 also receives the binary data byte BTPDATA0–7 on bus 90 and the control signals on lines 70 from the control circuit 44. Thus the look-up table 238, which is implemented using a ROM, merely uses the information presented at its inputs to look up the appropriate outputs in its memory and output them on bus 242 and the code-word to be transmitted in parallel form.

Figure 6:
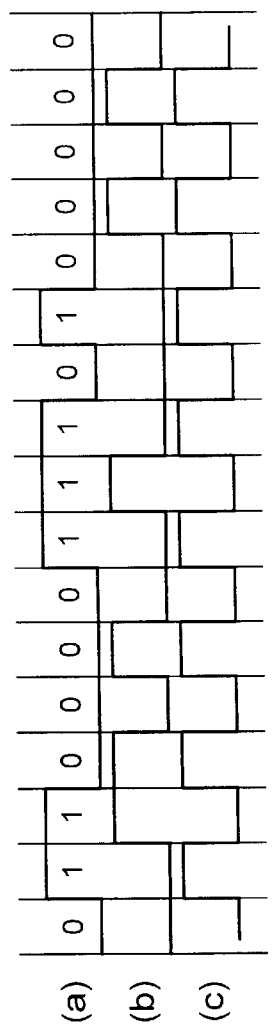
FIG. 6 is a timing diagram exemplifying a data strobe encoding technique.

Referring once again to FIG. 2, it can be seen that the serial code-words CODEW on line 88 output from the 8B10B encoder 50 are input to the data strobe encoder 54 for generation of the buffered data code-words BCODEW on line 86 and the strobe signal STROBEW on line 84. As was mentioned hereinabove earlier, the serial strobe signal STROBEW on line 84 is generated such that at the bit boundaries of the data signal where there is no transition there is a transition on the strobe signal, and at the bit boundaries of the data signal where there is a transition there is no transition on the strobe signal. Thus referring to FIGS. 6a and 6b there is shown a serial data stream in FIG. 6a and a corresponding parallel serial strobe signal in FIG. 6b. As can be seen, the strobe signal is generated such that it transits always, but only at, bit boundaries of the data signal where there is no transition.

Figure 7:
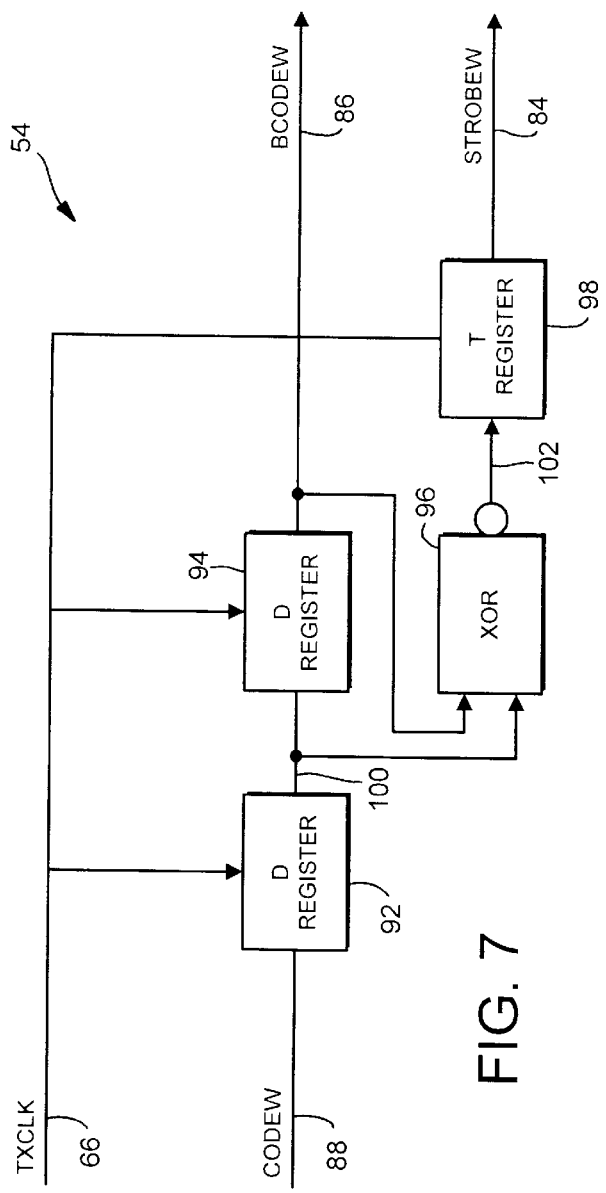
FIG. 7 is a block diagram of circuitry for encoding a data signal into data and strobe signals.
Figure 8:
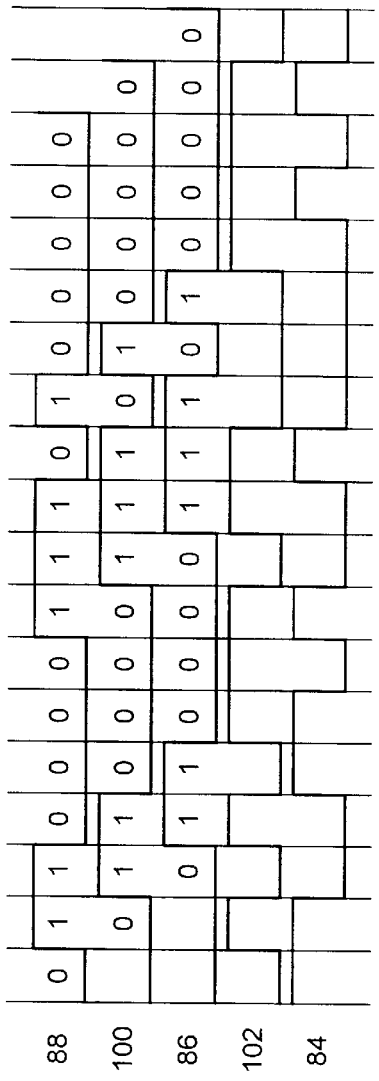
FIG. 8 is a block diagram showing the timing signals at various points in the circuit of FIG. 7.

Referring now to FIG. 7, there is shown a possible implementation of a data strobe encoder 54. The data strobe encoder 54 includes two D-type registers 92 and 94, a T-type register 98, and an exclusive NOR gate 96. Each of the D-type register 92, D-type register 94, and T-type register 98 receive the transmit TXCLK on line 66. The operation of such a circuit is known from earlier European Patent Application Publication No. 0458648, and therefore will not be described in detail herein. The waveform signals at various nodes of the data strobe encoder 54 of FIG. 7 are shown in FIG. 8. Essentially the serial data code-word CODEW on line 88 is clocked by the transmit clock TXCLK through two successive D-type registers 92 and 94 onto the signal line 86 to form the buffered serial code-word BCODEW. The output of the D-type registers 92 and 94 form the inputs to the exclusive NOR gate 96. Thus the exclusive NOR gate will output a logic one if the outputs of the two D-type registers 92 and 94 are both the same, i.e. if there is no transition between the two successive bits of the serial code-word CODEW which are at the outputs of the two D-type registers 92 and 94. The T-type register 98 is such that its output changes state if its input is logic one when clocked. Thus a high output on the output of the exclusive NOR gate 96 on line 102 will cause a change of state on the STROBEW signal line 84 output from the T-type register when the bits on lines 100 and 86 are the same indicating no transition of the data signal.

The data signal including the code-word BCODEW on line 86 is dc balanced owing to the encoding technique employed in the 8B10B encoder 50 described herein above in which the running digital sum of the data signal and code-word boundaries is minimised. However, the strobe signal STROBEW on line 84 is not dc balanced. In the preferred embodiment of this invention the serial data and parallel strobe signal are to be transmitted over respective twisted pairs, and the interface for coupling these signals to those twisted pairs is provided by a pair of transformers. However signals can only be used to interface with the transformers if they are dc balanced. Thus it is desired to dc balance the serial strobe signal STROBEW on line 84.

The dc balancing of the STROBEW signal on line 84 is achieved by converting the signal into a ternary three-level signal, having one of three states: −1, 0, or +1.

In the preferred embodiment of this invention, both the serial data signal BCODEW on line 86 and the serial strobe signal STROBEW on line 84 are converted into ternary signals. Although the serial data signal BCODEW on line 86 is already dc balanced, encoding it into a ternary signal further improves the spectral characteristics of the serial data signal. A simple pseudo-ternary code is used to encode the binary signals CODEW and STROBEW. The encoding scheme is such that a binary zero is always represented as a ternary zero, and a binary one is always represented as either a −1 or a +1. In this way the decode of the ternary signal, as will be described in further detail hereinafter, is a simple rectification of the receive signal. The encoding from binary into ternary is such that there are never any two-level transitions, i.e. the ternary signal never transits from −1 to +1 on a trit boundary or between +1 to −1 on a trit boundary. All the transitions are single-level transitions, i.e. between a −1 and 0, 0 and −1, +1 and 0, or 0 and +1 at trit boundaries.

The simple pseudo-ternary code employed by the preferred embodiment of the present invention is regulated mark inversion (RMI). There is a variety of RMI codes, depending on the permitted run length of the binary signal input to the RMI encoder.

The actual coding rules for the ternary encoding scheme employed in the present invention are:

a) if the running digital sum of the ternary encoded signal is positive and at least two 0s have been transmitted since the last +1, then the next 1 is transmitted as −1;

b) if the running digital sum of the ternary encoded signal is negative and at least two 0s have been transmitted since the last −1, then the next 1 is transmitted as +1;

c) if the running digital sum of the ternary encoded signal is negative and at least two is follow any numbers of 0s, then those is are transmitted as +1;

d) If the running digital sum of the ternary encoded signal is negative and at least two is follow any number of 0s, then those is are transmitted as +1.

e) otherwise the polarity of 1s is reversed each time a run of at least one 0 occurs.

An example of a circuit for implementing the ternary encoding scheme is illustrated in FIG. 9. The circuit of FIG. 9 is an example of the data ternary encoder 56 of FIG. 2. An identical circuit would be used to implement the strobe ternary encoder 58 of FIG. 2. The data ternary encoder 56 includes a latch 104, a state machine 106, a counter 108, and a pair of resistors 107 and 109. The latch 104 receives the serial data code words BCODEW on line 86 and transfers its latched output to an input of the state machine 106 via line 110. In addition the state machine 106 receives the serial data code words BCODEW on line 86 as a second input. The state machine 106 outputs signals on lines 112 and 114, which signals form inputs to the counter 108. The counter 108 generates an output signal on line 116 to the state machine 106. The resistors 107 and 109 are connected in serial fashion, with one end of the resistor 107 being connected to the signal line 112 and one end of the resistor 109 being connected to the signal line 114, the other ends of the resistors 107 and 109 being connected together. The common point of connection between the resistors 107 and 109 forms the output signal TSDATA on line 18 of the data ternary encoder 56. In addition each of the latch 104, state machine 106 and counter 108 receive the transmit TXCLK on line 66.

The state machine 106 outputs signals on lines 112 and 114 in accordance with whether the ternary trit is to be −1, 0 or +1. The resistors 107 and 109 convert the signals on lines 112 and 114 into ternary trits on line 18. The counter 108 counts the signal on line 112 and 114 to calculate the running digital sum of the ternary encoded code-words. The running digital sum thereby calculated is outputted on line 116 to state machine 106. In addition it will be clear from the operation of the latch 104 that the state machine receives as inputs the current incoming serial bit of the code-word BCODEW on line 86, and the previous bit-of the code-word BCODEW latched by the latch 104 onto line 110. Thus the state machine 106 knows the value of the current bit to be encoded, the previous bit encoded, and the running digital sum of the code-word. The state machine contains an algorithm allowing the rules (a) to (e) described hereinabove to be implemented.

FIG. 10 shows the logic state diagram for the state machine 106 of FIG. 9.

Figure 11:
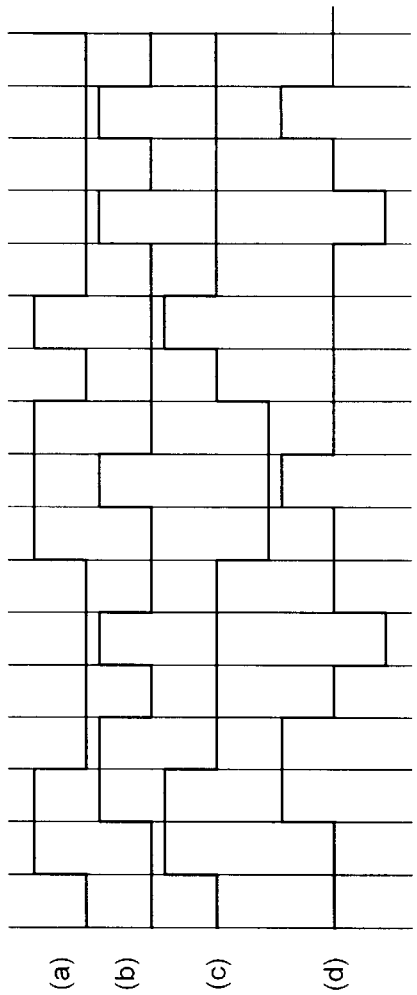
FIG. 11 is a timing diagram exemplifying the operation of the ternary encoder of FIG. 9.

FIG. 11 shows example waveforms of the binary data signal code-words in FIG. 11a, and the binary parallel encoded strobe signal in FIG. 11b. Also shown are the corresponding ternary encoded signals, with FIG. 11c showing the ternary encoded serial data signal TSDATA on line 18 and FIG. 11d shows the ternary encoded serial strobe signal TSSTROBE on line 22.

The thus encoded ternary serial data code-word on line 18 and the ternary serial parallel strobe signal on line 22 are communicated to respective transformers 6 and 8 by the encoder/decoder 2 for transmission on the respective twisted pair links 38 and 40.

On the receive side, the encoder/decoder 2 receives from the respective transformers 6 and 8 the received serial ternary encoded signal RSDATA on line 20 and the received serial ternary encoded parallel strobe signal RSSTROBE on line 24 from the respective twisted pair links 38 and 40. On the receive side, the first operation which must be performed is to convert the received ternary signals into binary signals.

As mentioned hereinabove with regard to the description of the ternary encoding scheme, the conversion from ternary to binary with the advantageous ternary encoding scheme used is extremely simple, in that the incoming ternary signals merely need to be rectified to produce the binary data and strobe signals. Because on the transmit side a binary 1 is always encoded as a +1 or a −1, then rectifying the incoming ternary signal means that the +1 or −1 on the ternary signal is always decoded as a 1, and a 0 is always decoded as a 0. Thus, the decoder circuitry of the encoder/decoder 2 comprises at the input stage thereof a data rectifier 60 and a strobe rectifier 62 for receiving the respective ternary serial data signal RSDATA on line 20 and ternary serial strobe signal RSSTROBE on line 24. Data rectifier 60 outputs on line 80, the rectified receive data signal RECDATA and the strobe rectifier 62 outputs on line 82 the rectified serial strobe signal RECSTROBE on line 82. The rectified data and strobe signals on lines 80 and 82 form inputs to the exclusive OR gate 64, and as will be appreciated from the foregoing description with reference to FIG. 7, the clock used to encode and transmit the data can simply be recovered from the output of this exclusive OR gate. Referring once again to FIG. 6, it will be understood that if the rectified data signal is that of FIG. 6a, then the rectified strobe signal is that of FIG. 6b. Thus the exclusive OR gate 64 receives as its two input signals the waveforms shown in FIGS. 6a and 6b. Thus the output of the exclusive OR gate 64 will be the waveform shown in FIG. 6c, which is the recovered transmit clock, which forms the receive clock RXCLK on line 78 of the output of the exclusive OR gate 64.

The rectified data signal RECDATA on line 80, which includes the serial 10 bit code-words received by the encoder/decoder 2, is input to the 8B10B decoder 52.

Figure 12:
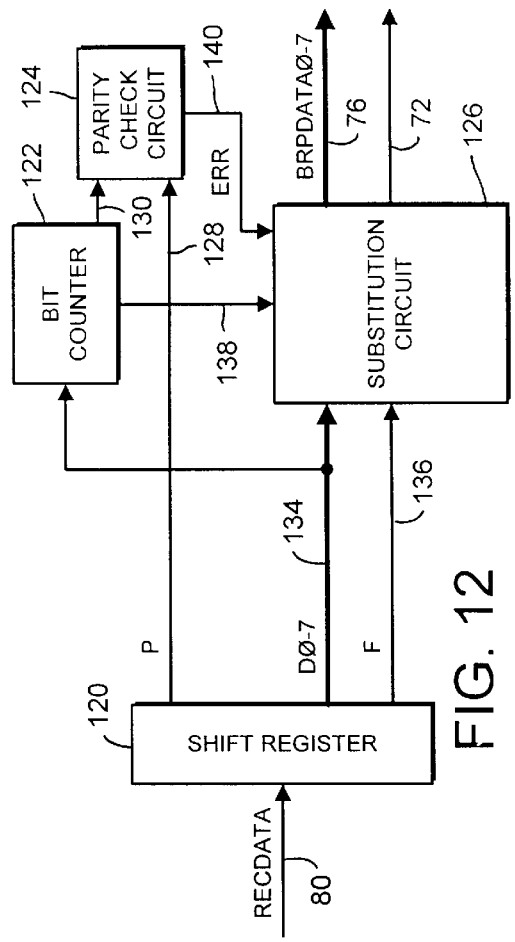
FIG. 12 is a block diagram of one implementation of a decoder according to the present invention.

In FIG. 12 there is shown a block diagram of a preferred implementation of the 8B10B decoder 52. The 8B10B decoder 52 includes a shift register 120, a substitution circuit 126, a bit counter 122, and a parity check circuit 124. Although not shown in FIG. 12 the reasons of clarity, each of the shift register 120, substitution circuit 126, bit counter 122 and parity check circuit 124 receive the receive clock signal RXCLK on line 78. The shift register 120 receives the rectified data code-words RECDATA on line 80 and converts them into 10 parallel bits. The parallel received data bytes of the data code-word is output from the shift register as bits D0–7 on line 134, the parity bit P of the received code-word is output from the shift register on line 128 and the flag bit F of the received code-word is output from the shift register 120 on line 136. The received data byte D0–7 forms an input to the bit counter 122 and the substitution circuit 126. The parity bit P forms an input to the parity check circuit 124. The flag bit F forms an input to the substitution circuit 126. The bit counter 122 generates count signals on lines 130 and 138, the count signal on line.130 forming an input to the parity check circuit 124 and the count signal on line 138 forming an input to the substitution circuit 126. The substitution circuit 126 outputs the received decoded data byte RPDATA0–7 on bus 76, and also the control signals, if any, on line 72 to the control circuit 44.

Thus, the parallel received data byte D0–7 is input to the substitution circuit 126 together with the flag bit F. The substitution circuit will, in dependence on whether the flag bit F is set or not, invert the data byte D0–7 or not. The bit counter 122 counts the number of is in the received data byte D0–7 and outputs this value on line 130 to the parity check circuit 124. The parity check circuit 124 checks to ensure that the number of is in a received code-word is an odd number. If the parity check circuit 124 detects a parity error, then an error signal ERR is generated on line 140 to the-substitution circuit. Such an error may well be communicated to the control circuit 44 via control line 72. The bit counter 122 also outputs the value of the bit count of the received data byte D0–7 to the substitution circuit 126 to assist the substitution circuit 126 in identifying those received data bytes which need to be substituted. If the code-word has zero disparity and the flag bit is set, then the received data byte needs to be substituted. If the code-word has non-zero disparity and the flag bit is set then the data byte is inverted. If the code-word has non-zero disparity and the flag bit is not set the data byte is not inverted. Substitution circuit 126 will contain a small look-up table for identifying those data bytes which require substitution together with associated logic circuitry.

Figure 13:
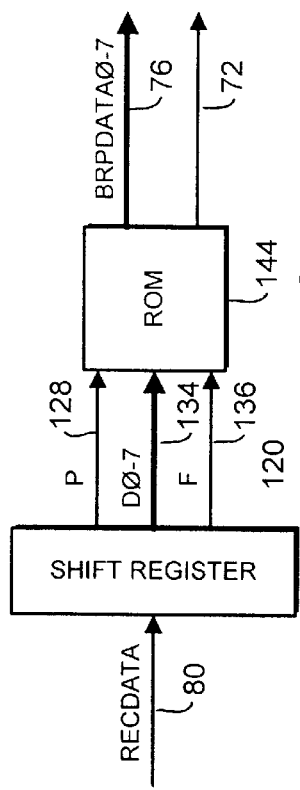
FIG. 13 is a block diagram of another implementation of a decoder according to the present invention.

Referring to FIG. 13 there is shown an alternative implementation of the 8B10B decoder 52. This implementation still includes the shift register 120 for receiving the rectified data code-words RECDATA on line 80 and for outputting the data byte D0–7, the parity bit P and the flag bit F. However the other blocks of the implementation shown in FIG. 12 are eliminated and replaced by a single read only memory (ROM). Thus the data byte D0–7, the flag bit F and the parity bit P are used as an address to the ROM to look up the appropriate decoded data byte for output as the data byte RPDATA0–7 on bus 76. In addition the ROM will also include the necessary control information which will be accessed by the address of the data byte D0–7, flag bit F and the parity bit P if such a code-word is a control code-word, and output the appropriate control signals on the line 72.

The decoded data byte BRPDATA0–7 on bus 76 is then input into the received FIFO 48 under the control of the receive clock RXCLK, and subsequently output on the bus 16 as the received data RPDATA0–7 for transmission to a destination device.

The preferable embodiment of the code has been described hereinabove with a parity bit. A number of communication codes discard parity in order to improve the coding efficiency. It is possible to discard parity in this code, which would result in a code word of nine bits. Instead of disparities of each code word of 0, ±4 and ±8, the code-words would have disparity ±1, ±3 or ±5, These disparities mean that the substitution codes have to be taken from those codes which have disparity +1, and so for the basic binary serial data code it is not possible to guarantee dc balance on the data signal line.

The rule for choosing the polarity of code-word depending on the previous parity bit, rule (c) hereinabove, would be changed to depend on the previous flag bit, which would become the last bit to be transmitted of each code-word.

The run lengths, both of consecutive ones and consecutive transitions, would in such an embodiment preferably be reduced to six between code-words. For those code-words which had the parity bit at 0, but the flag bit at 1, there are a few additional codes needing substitution, for example code 0001 1111 1 (decimal value 3 in Appendix 1), and some of the existing substitution codes also violate, such as the code used in Appendix 1 to substitute for decimal value zero. A further two code-words have a run length of seven internally, and these would need additional substitution codes (code 0111 1111 0, decimal value 254, with an internal run length of seven ones, and 0010 1010 0, decimal value 84, with an internal run length of seven transitions).

The code table in Appendix 1 has several spare substitution codes, and a possible allocation of these spare codes to the additional violations is given in enclosed Appendix 2.

While it is not possible to guarantee dc balance of this code, it is still possible further to encode it as a data strobe signal, with the strobe signal making a transition at every bit boundary where the data signal does not make a transition. It is also possible to further ternary encode it which ensures the dc balance of the data signal, or with ternary coding of both the data and strobe signals, which gives dc balance on both the data and strobe signals, while preserving the run length constraint of six consecutive ones and six consecutive transitions given by the code.

As with the preferred embodiment described above with parity, it may not be necessary to limit the run length as much as possible. For the code without parity, the run length of six can be achieved with the rules and with the substitution codes. A run-length of seven or eight or more could be achieved with fewer substitution codes and hence with less logic, and such a code may be preferable in certain applications to the code with the run length of six.

A benefit of the simple clock recovery with an exclusive OR gate is that it is possible to take the signals to a standby state when there is nothing to transmit, and then very quickly to restart transmission when there is data. In such a standby state both the data and strobe signals go quiescent.

A preferred algorithm for going to quiescence is:
1. If the last code-word sent was an end of packet or end of message control code-word, and the transmit FIFO 46 is empty, and there is no flow control token (or other link-level token) to send, send a GoToStandby code-word.
2. After the GoToStandby code-word, insert a dummy code-word which brings the ternary versions of the data and strobe signals both to zero and their running digital sum to zero. This code-word need not follow the normal rule of a data bit of the code-word being transmitted every clock cycle, and the value of the code-word must be ignored by the receiver.
3. The dummy code-word first brings the strobe signal to zero.

4. It then brings the ternary version of the data signal to zero disparity and then to zero, without the strobe signal changing during this adjustment.

5. It then brings the ternary version of the strobe signal to zero disparity and then to zero, without the data signal changing during this adjustment.

6. If less than six transitions have occurred in the dummy code-word so far, the strobe signal is cycled through four (or eight) transitions so that no more than three transitions are needed when the transmission needs to "wake up".

7. At this point the line is quiescent with no energy stored in the transformers, and can stay in that state until there is new data to transmit.

8. When there is new data to transmit, the strobe signal is cycled through as many transitions as are necessary to complete the dummy code-word (a maximum of three transitions), and the new code-word is transmitted).

Figure 14:
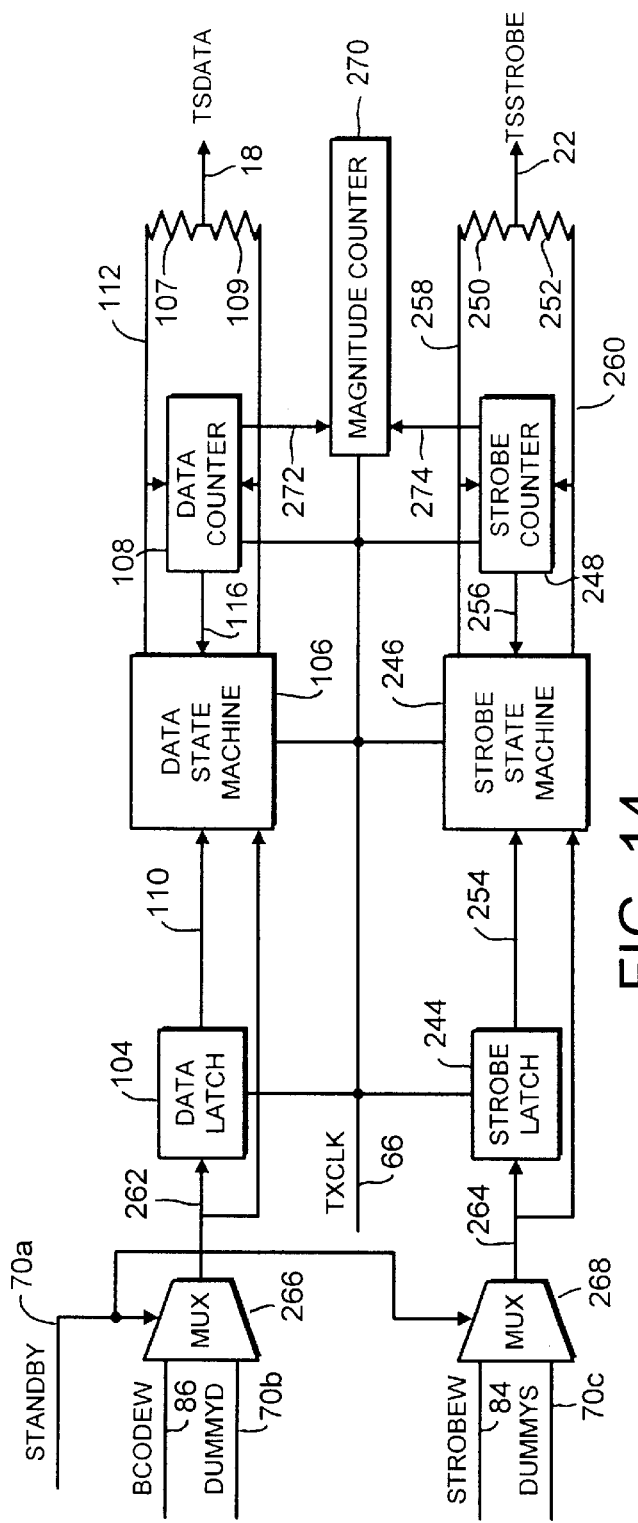
FIG. 14 is a block diagram of circuitry for enabling the data and strobe signal lines to go into a quiescent state.
Figure 15:
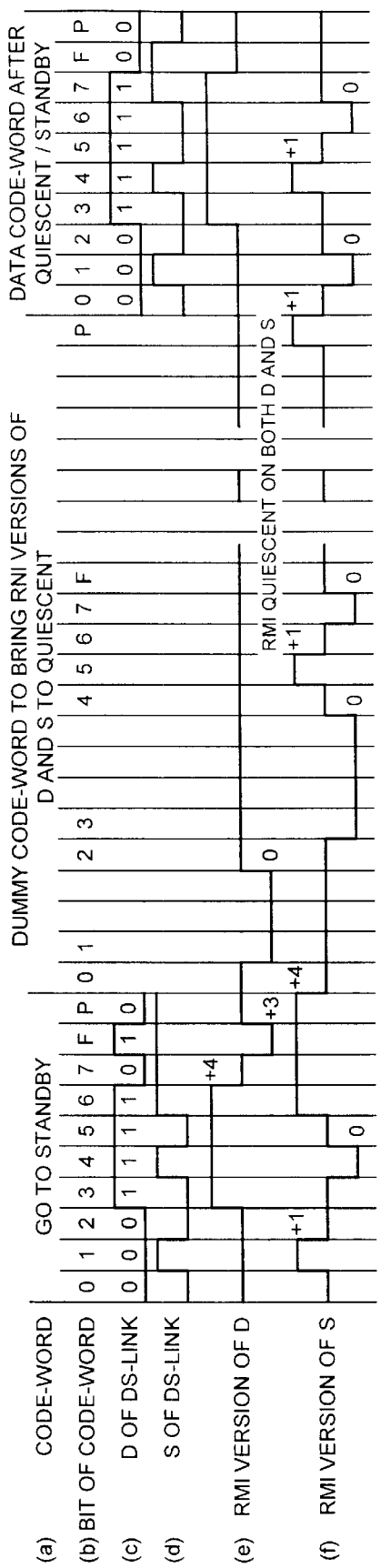
FIG. 15 is a timing diagram exemplifying the operation of the circuit of FIG. 14.

An example of circuitry for implementing the GoTo-Standby control technique is shown in FIG. 14, and FIG. 15 shows examples of the sequence of signals generated in such circuitry.

In FIG. 14 there is shown each of the data ternary encoder 56 and strobe ternary encoder 58 of the encoder/decoder 4. As will be appreciated from FIG. 9 hereinabove, the data ternary encoder 56 comprises the data latch 104, the data state machine 106 and data counter 108, together with the resistors 107 and 109, interconnected identically as described hereinabove with reference to FIG. 9. Similarly, the strobe ternary encoder 58 comprises a strobe latch 244, a strobe state machine 246, a strobe counter 248, and resistors 250 and 252. Each of these elements of the strobe ternary encoder 58 is connected in an identical fashion to that of the data ternary encoder 56 as described herein above with reference to FIG. 9. In addition in accordance with this embodiment of the invention with the provision of the Go To Standby control protocol, the data ternary encoder 56 additionally comprises a multiplexor 266 and the strobe ternary encoder 58 additionally comprises a multiplexor 268. A magnitude comparator 270 is provided common to each of the data ternary encoder 56 and the strobe ternary encoder 58.

The multiplexor 266 receives the buffered serial data code-word BCODEW on line 86 on one input and a dummy data signal DUMMYD on line 70b on a second input. The multiplexor 266 receives a control signal STANDBY on line 70a which is one of the signal lines 70 generated by the control circuit 44. The multiplexor 268 of the strobe ternary encoder 58 receives on one input thereof the serial data strobe signal STROBEW on line 84, and on the other input thereof a dummy strobe signal DUMMYS on line 70c which is one of the control signals 70 generated by the control circuit 44. The multiplexor 268 also receives as a select control input the signal STANDBY on line 70a. In normal operation of the device, when data and/or control signals are being transmitted on a serial data signal, the STANDBY signal on line 70a is set such that the serial data code-word BCODEW on line 86 is transferred to the output of the multiplexor 266 on line 262, and ternary encoded by the data ternary encoder 56 as described hereinabove with reference to FIG. 9. Similarly the STANDBY signal on line 70a controls the multiplexor 268 such that the serial strobe signal STROBEW on line 84 is output by the multiplexor 268 onto line 264 and ternary encoded in a similar manner to that described with reference to the data ternary encoder 56 in FIG. 9.

However, when the control circuit 44 determines that the transmit FIFO 46 is empty and there is no more data to be transmitted, then it sets the STANDBY signal on line 70a such that the multiplexor 266 transfers the serial dummy data signal DUMMYD on line 70b to line 262, and the multiplexor 268 transfers the dummy strobe signal DUMMYS on line 70c to line 264. Thus the dummy data and dummy strobe signals are ternary encoded by the respective ones of the data ternary encoder 56 and the strobe ternary encoder 58. The control circuit 44 then outputs signals on each of the dummy data signal line 70b and dummy strobe signal line 70c to bring the transmission line to a quiescent state.

Firstly, the control circuit 44 outputs the control code-word corresponding to the Go To Standby control. This will be one of the data code-words having 0 disparity which is reserved for control purposes. Thus, on the receive side, when the 8B10B decoder 52 decodes the Go To Standby control code-word, the control circuit 44 on the receive side will decode such control code-word.

Referring to FIG. 15, there is shown example waveforms generated when there is no data to be transmitted and the system is to be brought to a quiescent state. The first 10 bits transmitted are the respective bits of the Go To Standby control word. Thus as shown in FIG. 15b in this particular embodiment of the invention the code-word 0001 1110 10 is reserved as the Go To Standby control code-word. The corresponding strobe signal is generated on the dummy strobe line 70c having transitions at those bit boundaries of the dummy data signal where there are no transitions. The strobe signal is illustrated in FIG. 15d. Both the Go To Standby control code-word on the dummy data signal line 70b and the parallel strobe signal on the dummy strobe line 70c are encoded by the respective ternary encoders 56 and 58 to generate the respective ternary versions thereof as illustrated in FIGS. 15e and 15f.

Thereafter the control circuit 44 generates signals on the dummy data signal DUMMYD and dummy strobe signal DUMMYS on lines 70b and 70c respectively in accordance with steps 2 to 6 of the algorithm described herein above. The magnitude counter 270 is used to compare the transitions on the respective data and strobe signal lines in accordance with the steps 2 to 6 of the algorithm.

When the control circuit 44 receives control information on line 68 from the transmit FIFO 46 indicating that there are now data bytes to be transmitted, the system is woken up, in accordance with step 8 of the above algorithm, by cycling through as many transitions as are necessary to complete the dummy code-word. As can be seen in FIG. 15, only one transition is needed to complete the dummy code-word since 9 bits of the dummy code-word have been used to bring the data and strobe signals to a quiescent state. Thereafter a new data code-word is transmitted as normal with the standby signal on line 78 being reset.

Figure 16:
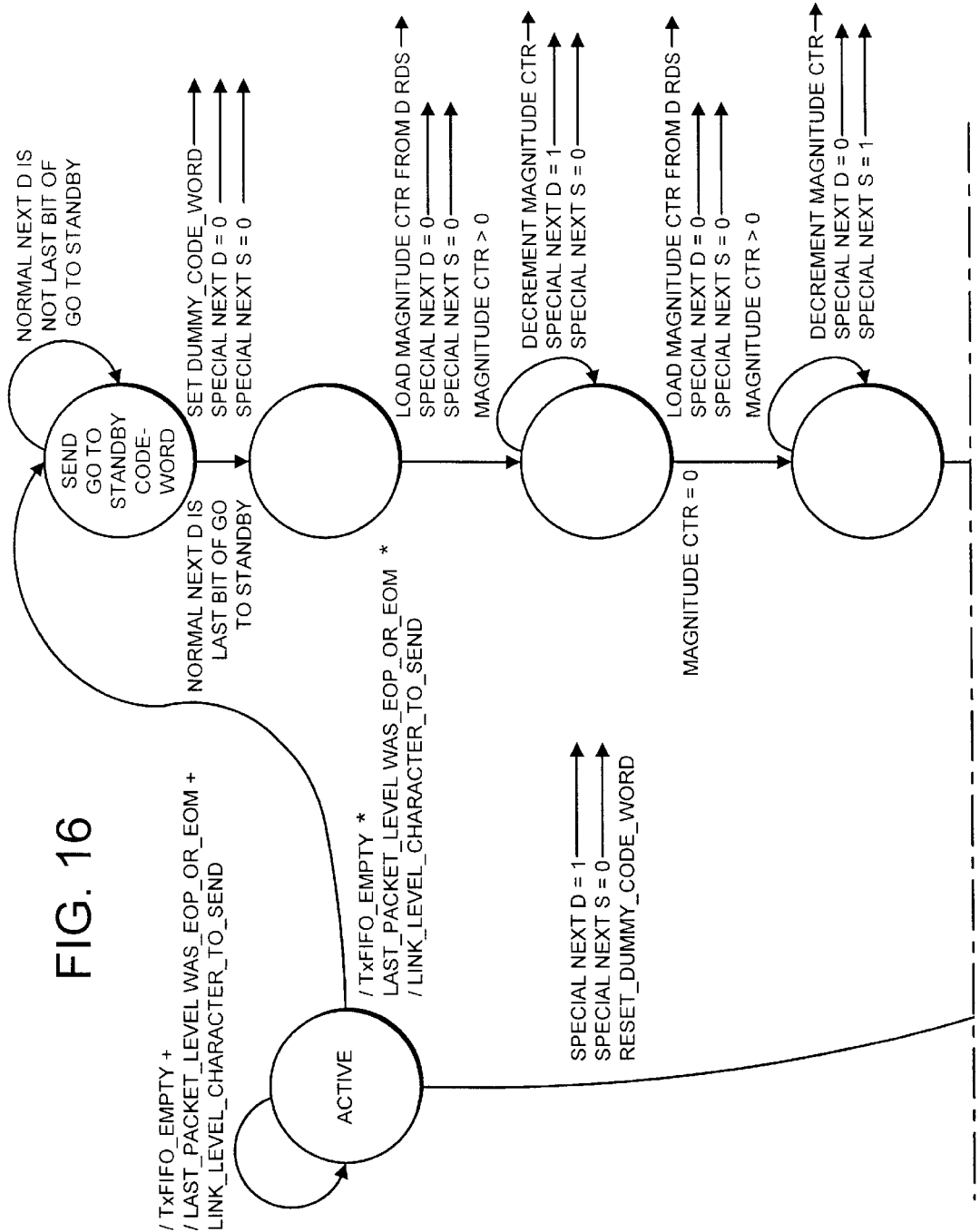
FIG. 16 is a state diagram of the operation of the circuit of FIG. 14.
Figure 16:
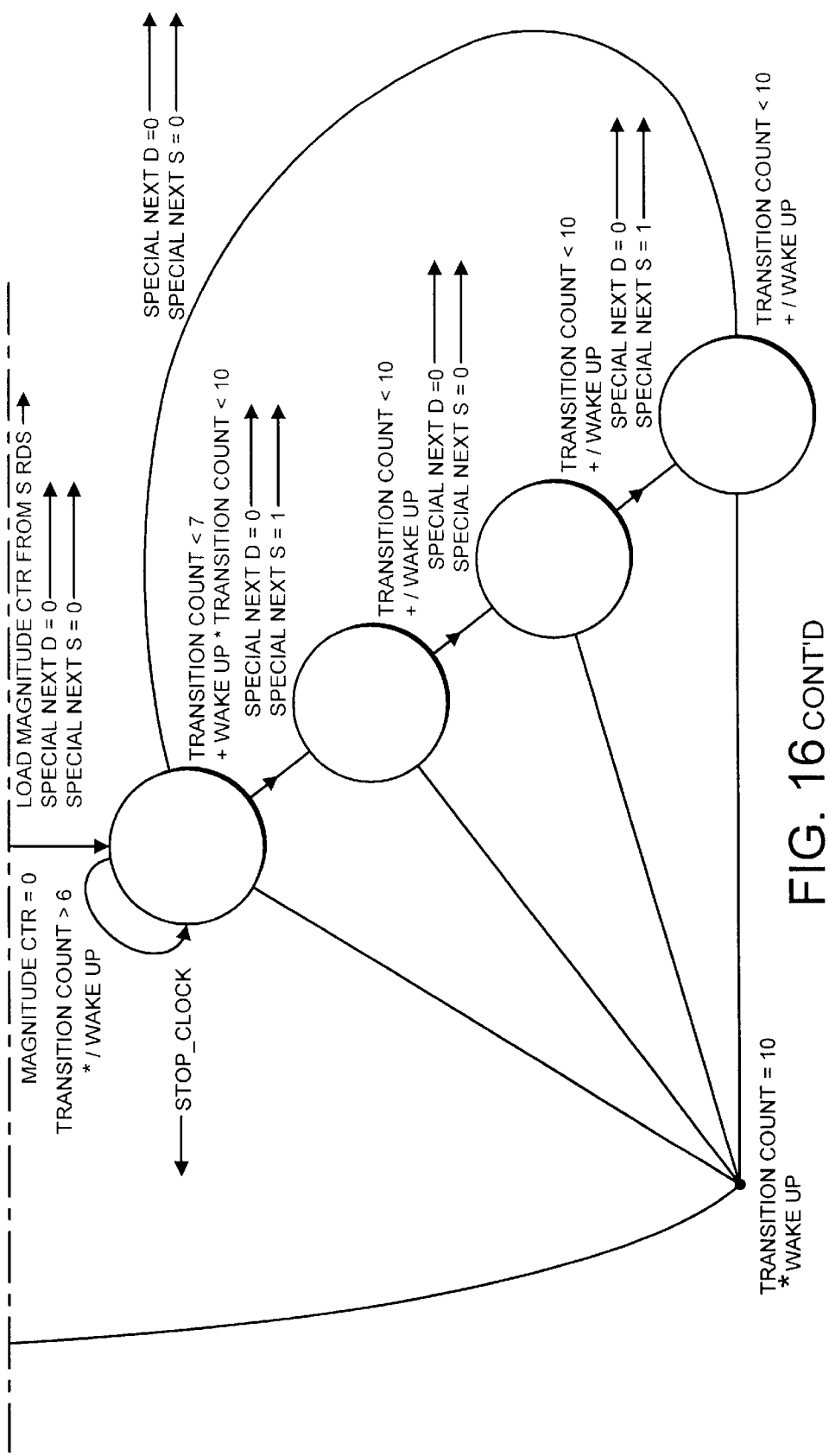

FIG. 16 shows the logic state diagram for either of the data state machine 106 or strobe state machine 246 of FIG. 14.

The data strobe encoding scheme, in which a serial strobe signal is generated parallel to a serial data signal, the strobe signal only having transitions at bit boundaries of the data signal where there are no transitions, and having no transitions at bit boundaries of data signal where there are transitions, provides for advantageous simple clock recovery at a receive end of a transmission link. In particular, such data strobe encoding techniques have significant advantages over conventional phase locked loop techniques for recovering clocks from received data at the receive end of a transmission link.

The receiver depends on the sequence of transitions between the data and strobe signals, and not on their timing with respect to some fixed-frequency clock. There is a full bit-time of skew tolerance, twice the skew tolerance of the data with respect either to a clock carried in a parallel wire or to a clock recovered from the data itself using conventional phase locked loop clock recovery techniques.

Because the transmit clock does not need to be a fixed frequency, the transmit clock frequency can vary, as with "Spread Spectrum Clocks" being used as the master clocks in personal computers (PCs) to reduce their EMC emissions. This benefit is potentially of more benefit to communications between computers, via comparatively uncontrolled wiring outside the box, than it is to the computers themselves which are in a comparatively well-controlled environment inside a box.

Because the clock can change instantaneously from high speed to dc and then, maybe some time later, switch back again to high frequency, it offers the opportunity of stopping transmission when there is nothing to transmit and starting up instantaneously when data arrives to be transmitted. The ability to be active and dissipating power only when there is traffic to transport offers a great opportunity for reducing power consumption, which is increasingly important for consumer products. It is important for the telephone and cable industries in the distribution of broad-band services, where dc is distributed to all subscribers' equipments and there is a need to minimise the load on this supply. This particular advantage has been described hereinabove with reference to the "GoToStandby" mode of operation.

An alternative to completely stopping transmission would be to run the clock more slowly when there is no traffic. This alternative would require larger transformers than would otherwise be necessary in order to limit the base-line-wander of the slower signals. A simple autonomous protocol for the use of such a mechanism would be that if the transmit FIFO is more than half full, the transmission speed doubles; if after transmitting a few more code-words, the FIFO is still more than half full, double the transmission speed again, and so on until maximum speed is reached; when the FIFO empties, transmission speed halves, and halves again if it stays empty. An even simpler protocol would be to run at full speed if there is data to transmit, and run at ⅛th speed (or some other fractional speed) when there is nothing to transmit.

In most communication systems, there is a need to distribute a clock, such as the 8 kHz clock used by the telephone system. One way to distribute this clock is on the phantom circuit described hereinafter. An alternative for clock distribution from a routing switch would be to pause the transmit clock at the end of a code-word on each output port when a synch code-word is received by the switch. Then, some fixed delay after the synch code-word is received (a delay long enough for all the output ports of the switch to have become paused), the synch code-word (labelled CLK in the code-table in Appendix 1) would be forwarded to all output ports of the switch at exactly the same time.

Figure 17:
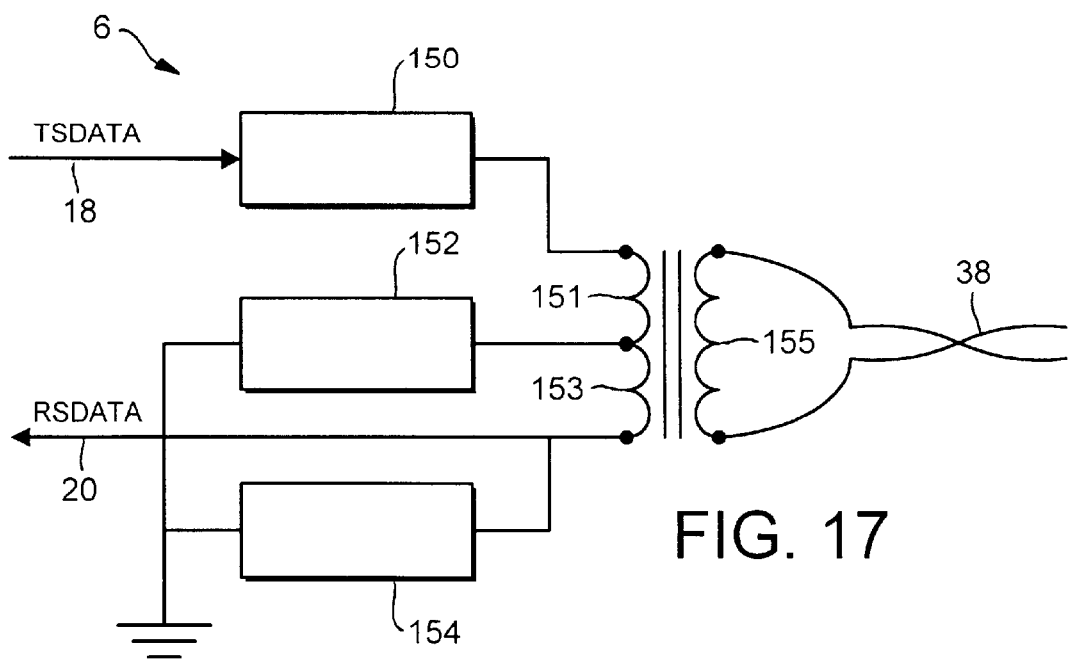
FIG. 17 is a diagram of a standard hybrid transformer.

The transformers 6, 8, 10 and 12 used to interface the twisted pair connections 38 and 40 between the respective encoders/decoders 2 and 4 of FIG. 1 are preferably each a standard arrangement hybrid transformer as shown in FIG. 17, but alternative bridge circuit implementations may be used. FIG. 17 illustrates the transformer 6 of FIG. 1, but it will be understood that each of transformers 8, 10 and 12 will be constructed identical to that of transformer 6. The transformer 6 includes three impedances 150, 152, 154 and a winding 156. The winding 156 has two primary windings 151 and 153 and a secondary winding 155. The two primary windings connect to the signals to be transmitted/received to/from the encoder/decoder 2, and the secondary winding connects to the twisted pair 38.

The connections are such that the winding connected to the encoder/decoder is split into two using a centre tap, and the winding connected to the twisted pair has the twisted pair connected across it. The use of transformer ratios of $\sqrt{2}:1$ between each of the windings connected to the encoder/decoder and the winding connected to the twisted pair is common and may be preferred. Instead of using the hybrid transformer as a bridge to cancel out the transmitted signal, another form of bridge circuit might be used.

The two primary windings 151 and 153 is FIG. 17 cancel each other out, so that the voltage on the node to which the signal line 20 is connected is a virtual earth, independent of the voltage to be transmitted on line 18. As the received signal is coupled into both primary windings, it is seen as a voltage on line 20.

Figure 18:
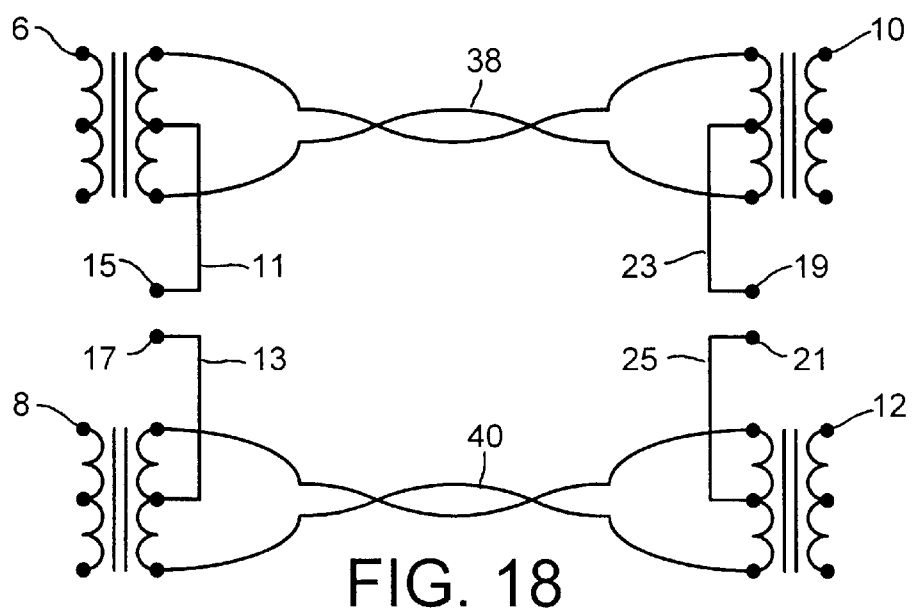
FIG. 18 is a diagram illustrating the formation of a phantom circuit employing four hybrid transformers.

A simple method by which the number of communication channels carried by a given number of wires can be increased is by use of a "phantom" circuit. Referring to FIG. 18 there is shown the four transformers 6, 8, 10 and 12 of FIG. 1, with the respective twisted wire links 38 and 40 therebetween. As can be seen from FIG. 18, the secondary winding of transformer 6 is connected to one end of the twisted pair 38 and the primary winding of the transformer 10 is connected to the other end of the twisted pair 38. Similarly the secondary winding of the transformer 8 is connected to one end of the twisted pair 40, and the primary winding of the transformer 12 is connected to the other end of the twisted pair 40. In addition, a connection is made from the centre tap of the secondary winding of the transformer 6 and to the centre tap of the secondary winding of the transformer 8. These connections, 11 and 13 respectively, are connected to terminals 15 and 17 to which a signal may be applied. Similarly a signal may be applied to the terminals 19 and 21, which are respectively connected via connections 23 and 25 to the centre tap of the primary winding of the transformer 10 and the centre tap of the primary winding of the transformer 12.

Thus the terminals 15 and 17 form one end of the phantom circuit, and the terminals 19 and 21 form the other end of the phantom circuit. The operation of a phantom circuit is well known, working on a balancing principle.

The twisted pair 38 and the twisted pair 40 provide high speed bidirectional links between the respective transformer pairs 6 and 10, and 8 and 12 respectively. The phantom circuit provides a lower speed bidirectional link between the terminal pairs 15 and 17, and 19 and 21 respectively.

Figure 19:
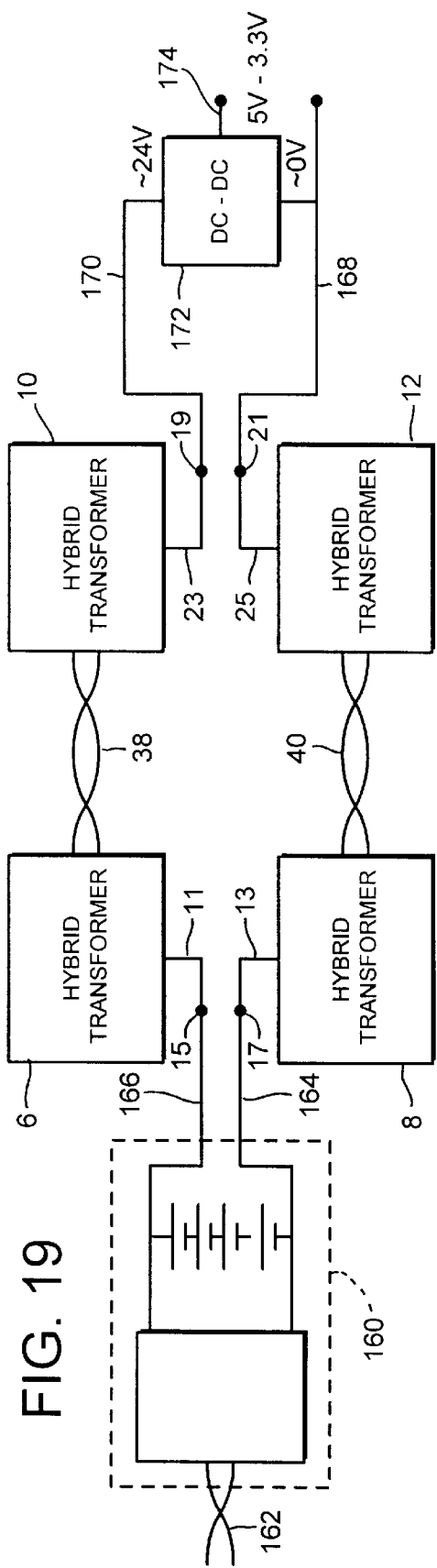
FIG. 19 is a block diagram illustrating the use of the phantom circuit to distribute power.

Referring to FIG. 19 there is shown an implementation of the phantom circuit discussed hereinabove according to a preferred embodiment of the present invention. In FIG. 19, a power supply, such as a battery charger or an ac/dc power supply 160 which receives a mains input on signal line 162, is connected across the terminals 15 and 17 via connections 164 and 166, signal lines 168 and 170 are connected to the respective terminals 21 and 19, a dc converter 172 being connected across the signal lines 168 and 170 and generating an output on signal line 174. Thus in the implementation of FIG. 19 the phantom circuit is used to deliver power. The twisted pair signal lines 38 and 40 are both in use transmitting high speed communication signals, and in this particular-example the transformers 10 and 12 will be connected to any peripheral device to which high speed information is being transmitted. In this example, power delivered down the phantom circuit is used to power the devices to which the high speed information is delivered. In a preferable embodiment of the invention, the twisted pair signal lines 38 and 40 communicate respective data and strobe signals.

The use of both wires of each twisted pair 38 and 40 to conduct the power supply current, via the phantom circuit, reduces the cable resistance and resulting power loss compared with a single dedicated twisted pair for supplying power. In the preferable embodiment the power supplied down the phantom circuit is a 24V power level, easily supplied by a lead-acid battery which is safe and can supply 10 to 30 watts or more of power per pair of twisted pair high speed communication links. Preferably the dc converter 172 is inverting and does not have a failure mode where the full 24V received can be supplied on the output signal line 174. Typically for a device to which power is being supplied the output signal line 174 will have a 5V or 3.3V output. The combination of battery charger, power supply and batteries is equivalent to a normal uninterruptable power supply (UPS) except that the UPS does need the inverter back to mains voltage.

Figure 20:
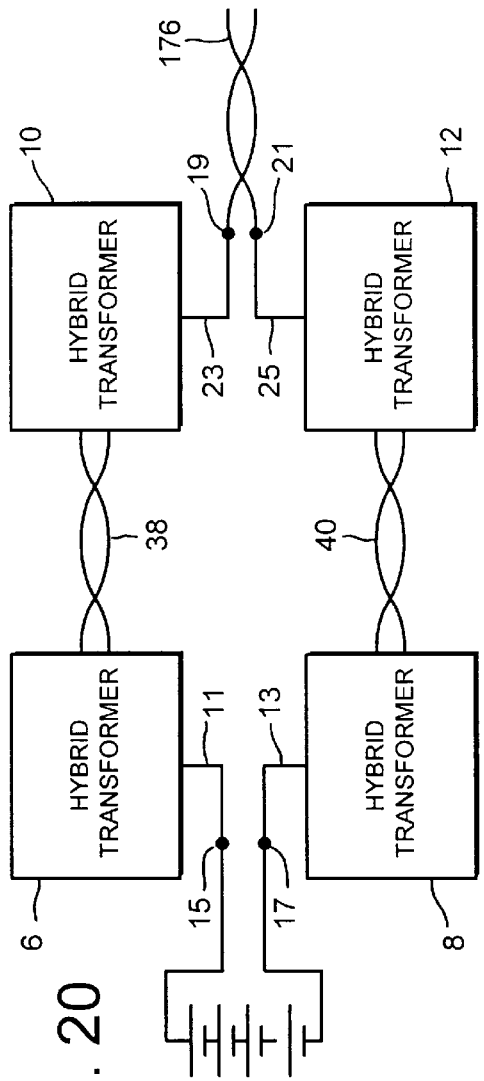
FIG. 20 is a block diagram illustrating an alternative use of the phantom circuit.

Referring to FIG. 20 there is shown another implementation according to a preferred embodiment of the present invention utilising the phantom circuit. In this embodiment, the phantom circuit is used for a "power line" signalling scheme such as CEBUS or LON. These normally connect to the 120V or 240V ac mains, but would connect much more simply to the dc power supply as does the WattCAN version of the CAN standard, or as do the POTS and ISDN phone lines.

Figure 21:
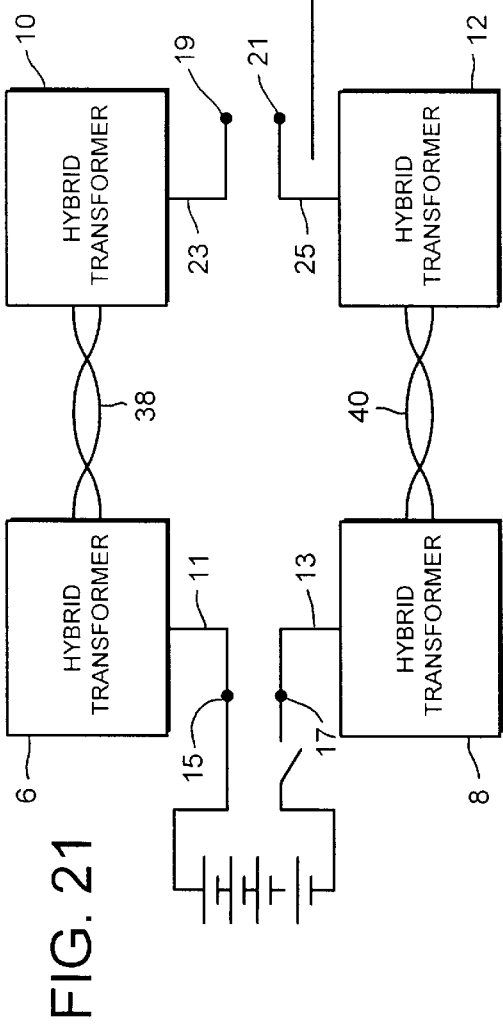
FIG. 21 is a block diagram illustrating use of the phantom circuit to additionally distribute a clock signal.

Referring to FIG. 21 there is shown another preferred embodiment of the present invention in which a series switch is connected to a one of the terminals 15, 17 for interrupting the power supply applied to that terminal. In FIG. 21 a switch 178 is shown connected to the line 164. Such a switch in series with the power supply 160 can be used to limit the current supplied by the battery to each cable. Alternatively, or in addition, the switch could be opened periodically to provide a global signalling clock. For instance if the switch was opened for 1 µs every 125 µs then a 8 kHz clock such as used in telephone systems would be provided.

Figure 22:
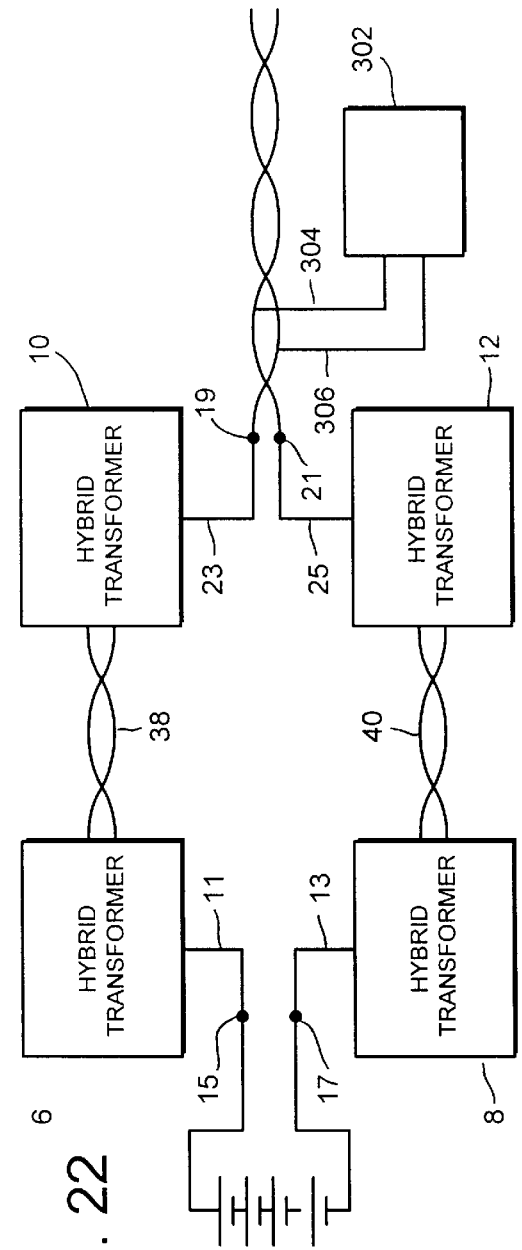
FIG. 22 is a block diagram illustrating an alternative use of the phantom circuit.

It is possible that a single chip could integrate the power supply, transceiver, bus protocol logic, and microprocessor—a level of integration very difficult for mains connections. The SGS-THOMSON L6901 is nominally a battery charger IC, but includes a 5V power supply plus a 4 Amp dc-dc converter, a microprocessor, OTP EPROM, and a small amount of RAM. It also includes EEPROM and an 8 bit A to D converter, and is clearly very close to including all the necessary circuitry in a single chip. The communications protocol for such a bus could be implemented in software by the microprocessor, and the 4 Amp output amplifier could be used as a very low impedance driver to output to the bus (a low impedance driver is needed in such circuits because the battery/power supply impedance is low). An example of how such a single chip would be connected is shown in FIG. 22. A further twisted pair 300 is connected to the phantom circuit terminals 19 and 21. A single chip circuit 302 has connections 304 and 306 to the power supply on the twisted pair 300.

If, as disclosed in the data strobe encoding scheme according to European Patent Application Publication No. 0458648, there is an initialisation routine which waits for valid codes, the receiver can also be designed so that the two twisted pairs can be swapped.

The initialisation routine to allow the pairs to be swapped looks for NUL tokens on both the data and the strobe received signals, and consequently chooses which of the two decode outputs generated by the data rectifier 60 and the strobe rectifier 62 to treat as the data signal and which to treat as the strobe signal.

Figure 23:
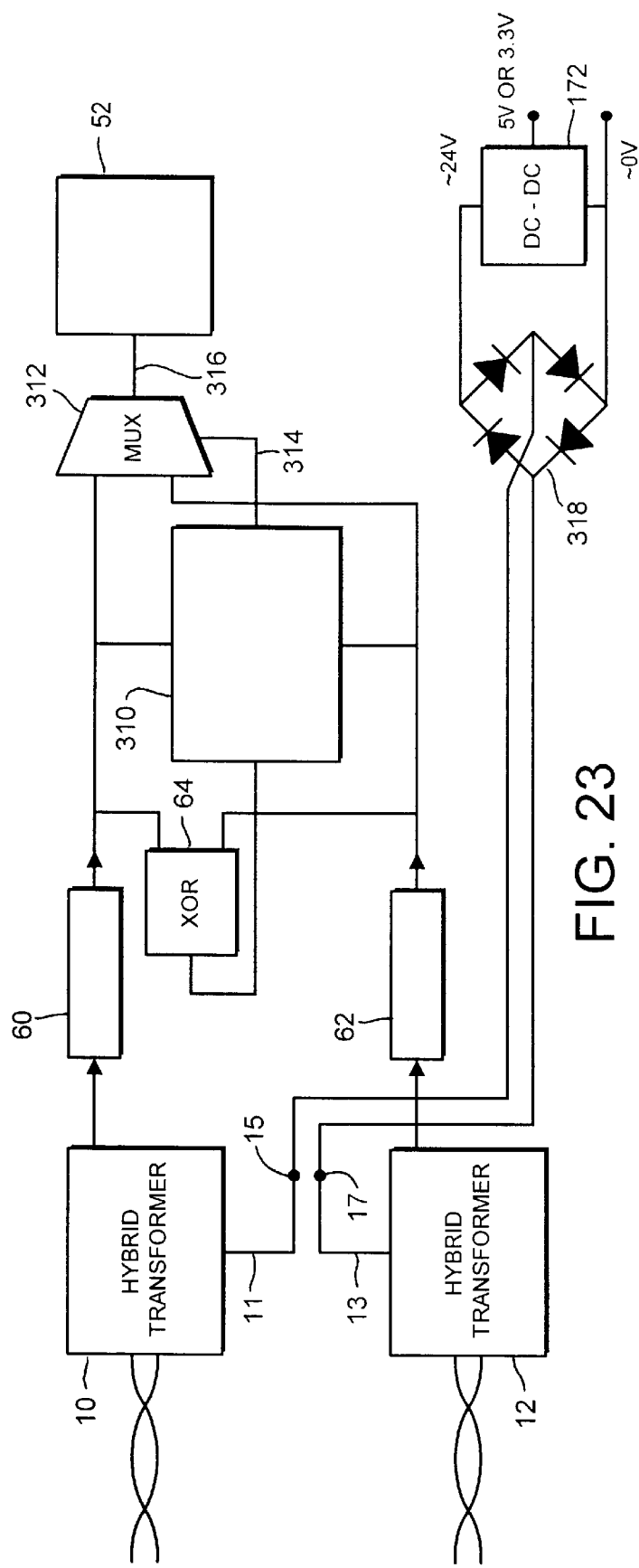
FIG. 23 is a block diagram of circuitry used for detecting, on a receive side, which of two twisted pair links carries the data signal.

Referring to FIG. 23 there is shown an alternative implementation of the receive side of the encoder/decoder 2 of FIG. 2. There is additionally provided a state machine 310 and a multiplexor 312. The state machine 310 receives the receive clock RXCLK on line 78, and also receives the rectified serial data signal RECDATA on line 80 and the rectified serial strobe signal RECSTROBE on line 82. The state machine generates a signal on line 314 which controls the multiplexor 312. The multiplexor 312 receives as inputs the serial data signal RECDATA on line 80 and the received rectified serial strobe signal RECSTROBE on line 82. In dependence on which one of the signals RECDATA or RECSTROBE the state machine 310 identifies as carrying the appropriate control token, the state machine sets output 314 to choose that signal as the receive data signal and inputs it on line 316 to the 8B10B decoder 52.

Figure 24:
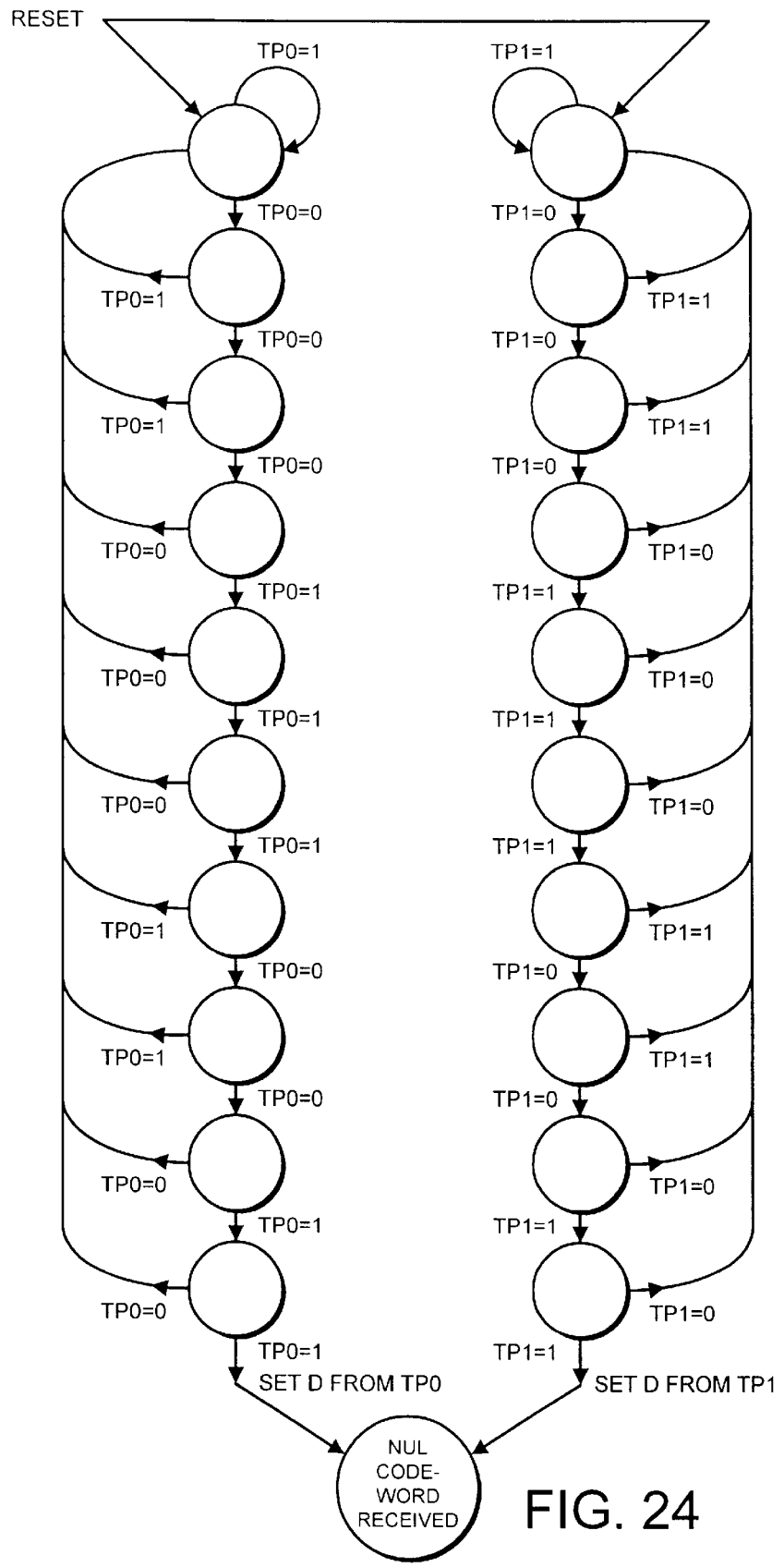
FIG. 24 is a state diagram of the circuitry of FIG. 23.

FIG. 24 shows the logic state diagram of the state machine 310 of FIG. 23.

The fact that the ternary decode is simply a rectification means that the individual wires of each twisted pair can also be swapped. Twisted pair 40 is shown in FIG. 23 with a missing twist, and so the signal seen at the hybrid transformer appears to be inverted. After rectification, the signal is unchanged from the signal of the overall block diagram in FIG. 2.

A bridge rectifier 318 is shown in FIG. 23 between the phantom circuit and the dc-dc converter 172. It is used to make the power supplied by the phantom circuit insensitive to the polarity of the power supplied. The power supplied by the phantom circuit is still a dc supply, in spite of the bridge rectifier.

The NUL code that the state machine 318 would preferably look for is the NUL code given in the code table in Appendix 1.

Figure 25:
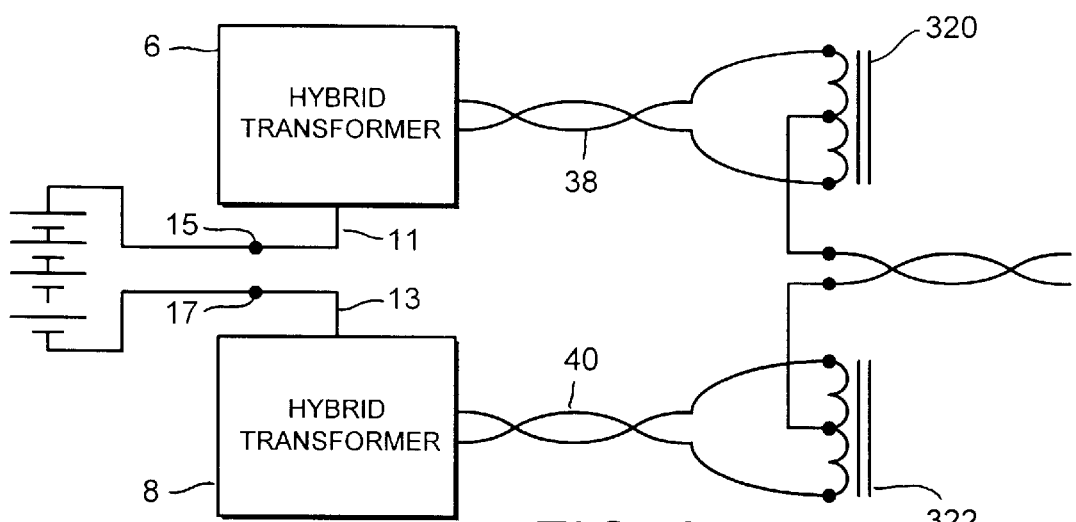
FIG. 25 is a block diagram illustrating the use of a phantom circuit to distribute power alone.

It is also possible to connect the phantom circuit when there is no encoder/decoder plugged in, by using half-transformers or common-mode chokes, as shown in FIG. 25. The transformers 10 and 12 are replaced by half-transformers 320,322.

Figure 26:
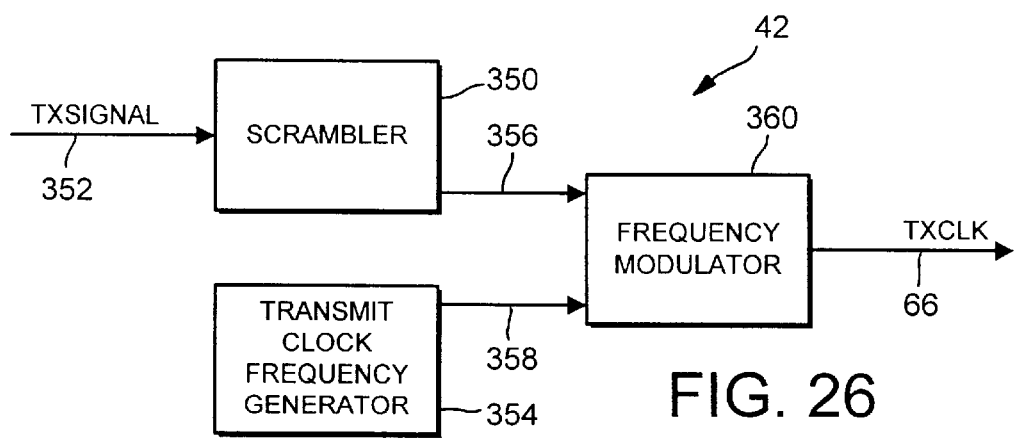
FIG. 26 is a block diagram illustrating the use of a variable frequency clock to distribute a signal.

A number of methods have been described above for providing additional communications or services via the phantom circuit. A further communications method is possible through the two twisted pairs 38 and 40 by the use of the spread spectrum clock. As shown in FIG. 26, the spread spectrum clock 42 preferably comprises a scrambler 350 a transmit clock frequency generator 354 and a frequency modulator 360. The spread spectrum clock modulates the clock frequency over a range from a few per cent of the nominal clock frequency up to about 10 per cent of the nominal clock frequency. The signal used to modulate the clock is generated internally inside a chip. However, as shown in FIG. 26, a signal source such as the transmit signal TXSIGNAL on line 352 is used as a modulator to a scrambler 350. The frequency modulator 360 then receives as inputs the output of the scrambler 350 on line 356 and the output of the transmit clock frequency generator 354 on line 358. The output of the frequency modulator 360 is the transmit clock TXCLK on line 66.

Figure 27:
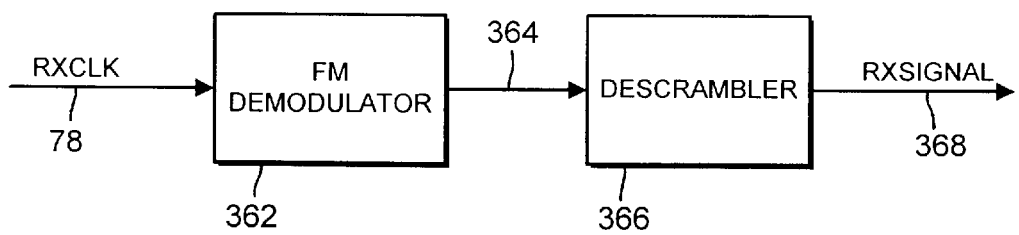
FIG. 27 is a block diagram illustrating the recovery of a signal transmitted using the circuitry of FIG. 26.

Referring to FIG. 27 there is shown circuitry for demodulating the recovered clock at the receiver, comprising an FM demodulator 362 and a descrambler 366. The FM demodulator 362 receives as an input the receive clock RXCLK on line 78 and presents its output on line 364 to a descrambler 366 for generating the receive signal RXSIGNAL on line 368 corresponding to the transmit signal TXSIGNAL on line 352. Although FIG. 26 shows the use of a scrambler 350 and consequently FIG. 27 shows the use of a descrambler 366, it is not essential to scramble the transmitter signal but it is preferable to do so to ensure the clock frequency is adequately spread.

Figure 28:
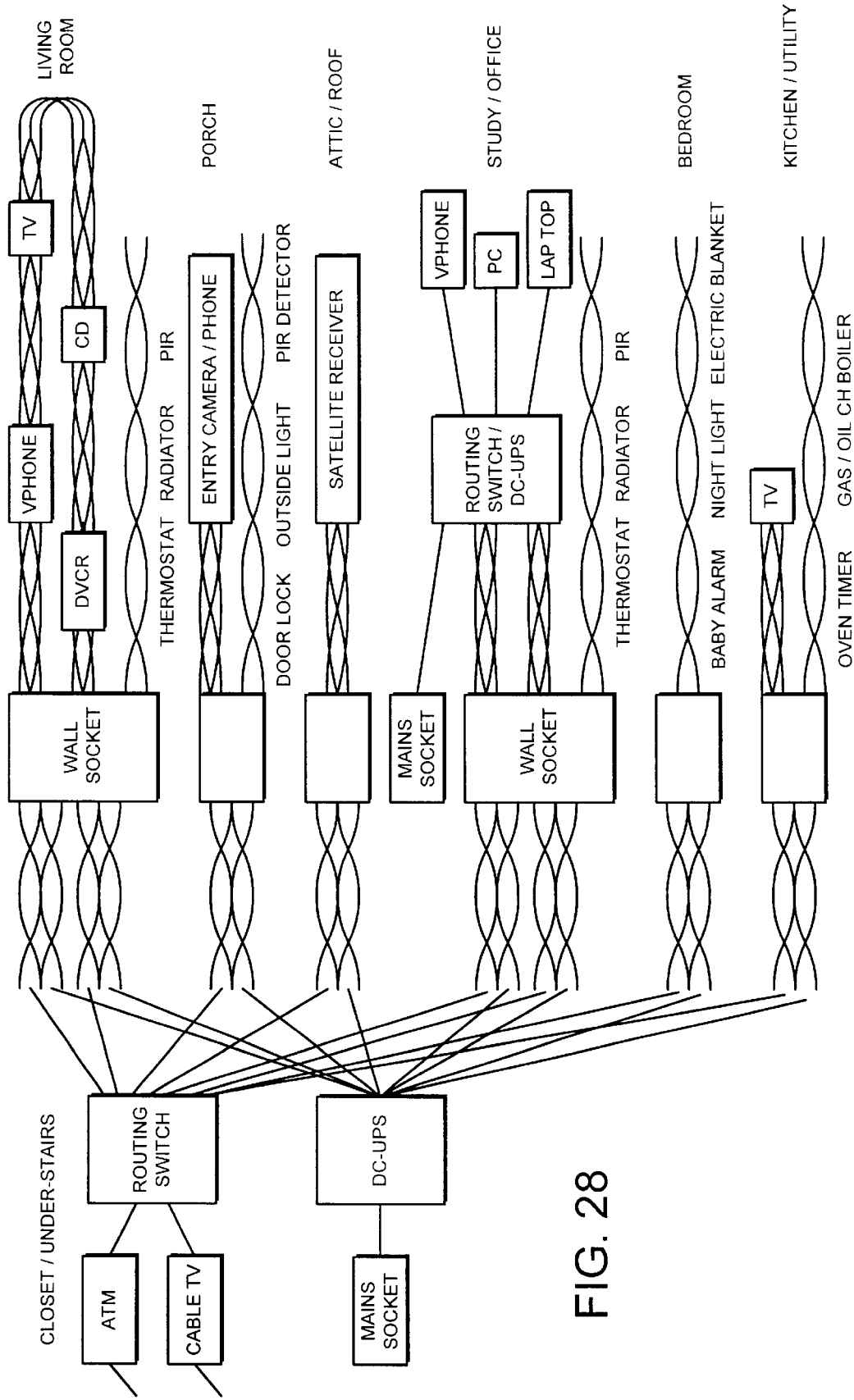
FIG. 28 is a block diagram illustrating the application of the present invention to a building environment.

FIG. 28 shows the outline of a home-wiring system based on the proposed technology. The routing switch and batteries (DC-UPS) would be in a closet, and would each connect via one or more DS pairs of twisted pairs to each room. Within each room, equipments might be connected individually to a wall socket or in a ring or other network, or be themselves connected by another routing switch and maybe separate power supply and DC-UPS.

What is claimed is:

1. A method of encoding data and strobe signals for transmission between first and second interconnected devices, the method including the steps of:

establishing a data signal path between said interconnected devices;

establishing a parallel strobe signal path between said interconnected devices, generating at said first device a binary data signal for transmission from said first device to said second device on said data signal path, said binary data signal carrying data comprising signal level transitions at predetermined bit boundaries;

generating a binary strobe signal for transmission from said first device to said second device on said strobe signal path, said binary strobe signal carrying timing information comprising signal level transitions at bit boundaries, said binary strobe signal having signal transitions at bit boundaries other than said predetermined bit boundaries on the parallel binary data signal;

encoding said binary data signal into a ternary data signal and said binary strobe signal into a ternary strobe signal, wherein the encoding step comprises selective inversion of signal levels such that each of said ternary signals is DC balanced for transmission from said first device to said second device.

2. The method of claim 1, wherein the encoding step comprises the steps of, for each of the data and strobe signal:

calculating a running digital sum of the ternary signal;

transmitting a next binary 1 as ternary −1 if a running digital sum is positive and at least two 0's have been transmitted since a last ternary +1;

transmitting a next binary 1 as ternary +1 if the running digital sum is negative and at least two 0's have been transmitted since a last ternary −1;

transmitting at least two successive binary 1's as ternary −1's if the running digital sum is positive and at least two binary 1's follow any number of 0's;

transmitting at least two successive binary 1's as ternary +1's if the running digital sum is negative and the at least two binary 1's follow any number of 0's; and otherwise reversing a respective polarity of each ternary 1 each time a run of at least one 0 occurs.

3. The method of claim 1, wherein the step of generating the binary data signal comprises:

receiving n binary bits for transmittal;

adding a flag bit to the n binary bits to form an n+1 bit binary code-word;

calculating a running digital sum of successively formed binary code-words;

outputting as the binary data signal successive code-words in which the n binary bits are in an inverted or non-inverted state depending on a current running digital sum oft he binary code-words, a flag bit being set to indicate inverted data.

4. The method of claim 3, wherein code-words having non-zero disparity are one of inverted and un-inverted such that a magnitude of the running digital sum at code-word boundaries is reduced.

5. The method of claim 3, wherein said adding step includes adding a parity bit to form a n+2 bit code-word.

6. The method of claim 5, wherein a value of the parity bit is selected to ensure an odd number of 1's in the code-word.

7. The method of claim 5, wherein binary code-words having zero disparity are not inverted.

8. The method of claim 5, wherein for code-words having zero disparity, code-words containing inverse data with a set flag bit are reserved for control purposes.

9. The method of claim 5 wherein for those code-words having zero disparity, the code-words containing the inverse data thereof with the flag bit set are used to substitute code-words to limit the running digital sum at boundaries of the binary code-words.

10. The method of claim 5, wherein for code-words having zero disparity, code-words containing inverse data thereof with a set flag bit are used to substitute code-words to minimize a run length on the ternary data and strobe signals.

11. The method of claims 3, wherein n=8.

12. The method of claim 1, wherein no data is available for transmission, the encoding step comprises generating extra ternary signals on each ofthe data and strobe signal communication paths until a running digital sum on each of said paths becomes zero, and then ceasing to generate further. ternary signals on said paths.

13. Data transmission circuitry for encoding data and strobe signals for transmission between first and second interconnected devices, comprising:

input circuitry adapted to receive a binary data signal and to supply said binary data signal for transmission on a data signal path between said interconnected devices, said binary data signal carrying data comprising signal level transitions at predetermined bit boundaries;

strobe-generation circuitry adapted to generate a parallel binary strobe signal for transmission on a strobe signal path between said interconnected devices, said binary strobe signal having signal transitions at bit boundaries other than said predetermined bit boundaries on the parallel binary data signal;

encoding circuitry adapted to encode said binary data signal into a ternary data signal and said binary strobe signal into a ternary strobe signal, wherein the encoding circuitry comprises an inverter arranged to selectively invert signal levels such that each of said ternary signals is DC balanced; and output circuitry for transmitting the ternary encoded data and strobe signals.

14. Data transmission circuitry according to claim 13, further comprising calculation circuitry for calculating a disparity of code-words, wherein when the disparity of a code-word is zero data therein is not inverted.

15. Data transmission circuitry according to claim 13, wherein said input circuitry further comprises bit generation circuitry adapted to generate a parity bit and addition circuitry adapted to add the parity bit to n binary bits and a flag bit to form an n+2 bit binary code-word.

16. Data transmission circuitry according to claim 13, further comprising control circuitry for controlling inversion circuitry to invert data in a code-word based on a running digital sum at code-word boundaries.

17. Data transmission circuitry according to claim 13, further comprising substitution storage means for storing code-words having zero disparity and set flag bits of the code words to indicate inversion of data therein, such code-words being used to substitute for code-words which increase a running digital sum at code-word boundaries or a run length of the data signal.

18. A method of decoding data and strobe signals transmitted between first and second interconnected devices, the method comprising the steps of:

establishing a data signal path between said interconnected devices;

establishing a parallel strobe signal path between said interconnected devices;

receiving a ternary data signal comprising a sequence of trits at said second device on said data signal path, said ternary data signal carrying data comprising signal level transitions at predetermined trit boundaries;

receiving a ternary strobe signal at said second device on said strobe signal path, said ternary strobe signal carrying timing information comprising signal level transitions at trit boundaries, said ternary strobe signal having transitions at trit boundaries other than said predetermined trit boundaries;

rectifying said ternary data signal into a binary data signal and said ternary strobe signal into a binary strobe signal;

exclusive-Oring said binary data signal and said binary strobe signal to generate a receive clock signal; and outputting said binary data signal under the control of said receive clock signal.

19. The method of claim 18, further including the step of:

checking to determine whether the code-word includes an odd number of 1's;

wherein received code-words comprise a parity bit, the parity bit being set to ensure an odd number of ones in the code-words.

20. Data receiving circuitry for receiving encoded data and strobe signals transmitted between first and second interconnected devices; comprising input circuitry adapted to receive a ternary data signal and a ternary strobe signal, said ternary data signal comprising a sequence of trits and carrying data comprising signal level transitions at predetermined trit boundaries, said ternary strobe signal being parallel to said data signal path and having signal level transitions only at trit boundaries other than said predetermined trit boundaries;

rectification circuitry adapted to rectify said ternary data signal into a binary data signal and said tertiary strobe signal into a binary strobe signal;

an exclusive-OR gate arranged to receive said binary data and said binary strobe signals and to generate a receive clock signal at its output; and output circuitry adapted to output the binary data signal under the control of the clock signal.

21. Data receiving circuitry according to claim 20, wherein received ternary code-words include a parity trit the data receiving circuitry further comprising a parity check circuit, the parity check circuit checking the parity of the received code-word based on the parity bit.

22. Data receiving circuitry according to claim 20, further comprising circuitry for calculating a disparity of each received code-word, wherein if the disparity of the code-word is zero and a flag bit of the code-word is set to indicate inversion, the data receiving circuitry further comprising storage means for storing code-words for substitution of code-words having zero disparity and flag bits which are set.

23. Data receiving circuitry according to claim 20, further comprising inversion circuitry, wherein if a disparity of the code-word is non-zero and a flag bit is set, then the inversion circuitry inverts data contained in the code-word.

* * * * *